(12) United States Patent
Nagoya et al.

(10) Patent No.: US 6,243,665 B1
(45) Date of Patent: Jun. 5, 2001

(54) MONITORING AND CONTROL APPARATUS INCORPORATING RUN-TIME FAULT DETECTION BY BOUNDARY SCAN LOGIC TESTING

(75) Inventors: Mitsugu Nagoya, Tokyo; Kazumi Sakamaki, Fujimi, both of (JP)

(73) Assignee: Duaxes Corporation, Tokyo (JP)

( * ) Notice: Subject to any disclaimer, the term of this patent is extended or adjusted under 35 U.S.C. 154(b) by 0 days.

(21) Appl. No.: 08/894,630
(22) PCT Filed: Dec. 25, 1996
(86) PCT No.: PCT/JP96/03777
§ 371 Date: Aug. 22, 1997
§ 102(e) Date: Aug. 22, 1997
(87) PCT Pub. No.: WO97/24670
PCT Pub. Date: Jul. 10, 1997

(30) Foreign Application Priority Data

Dec. 27, 1995 (JP) .................................................. 7-353737
Dec. 27, 1995 (JP) .................................................. 7-353738
May 17, 1996 (JP) .................................................. 8-147912

(51) Int. Cl.[7] .................................................. G06F 9/44
(52) U.S. Cl. ............................. 703/20; 703/21; 714/25; 714/727
(58) Field of Search ....................... 395/500.41, 500.42, 395/183.01, 183.13, 183.15, 183.16; 371/22.32; 710/100, 240; 703/20, 21; 714/25, 31, 727

(56) References Cited

U.S. PATENT DOCUMENTS

| | | | |
|---|---|---|---|
| 4,967,347 | * 10/1990 | Smith et al. | 364/200 |
| 5,444,716 | * 8/1995 | Jarwala et al. | 714/727 |
| 5,499,374 | * 3/1996 | Di Giulio et al. | 710/107 |
| 5,627,842 | * 5/1997 | Brown et al. | 714/727 |
| 5,630,048 | * 5/1997 | La Joie et al. | 395/183.01 |
| 6,000,040 | * 12/1999 | Culley et al. | 714/31 |

FOREIGN PATENT DOCUMENTS

| | | | |
|---|---|---|---|
| 57-52912 | 3/1982 | (JP) | G05B/23/02 |
| 58-43046 | 3/1983 | (JP) | G06F/11/22 |
| 4-50678 | 2/1992 | (JP) | G01R/31/28 |
| 4-20273 | 7/1992 | (JP) | G01R/31/28 |
| 6-18628 | 1/1994 | (JP) | G01R/31/28 |
| 7-168732 | 7/1995 | (JP) | G06F/11/22 |

OTHER PUBLICATIONS

Le et al., "Environmental Stress Testing with Boundary–Scan", Proc. International Test Conference 1994, pp. 307–313, Oct. 1994.*
McLeod, G. R., "Built–in System Test and Fault Location", Proc. International Test Conference 1994, pp. 291–299, Oct. 1994.*
Wedge, G., "Using Boundary Scan with a Fault Dictionary to Test and Diagnose Clusters of Non–Scan Logic", Conference Record on AUTOTESTCON '96, pp. 400–404, Sep. 1996.

* cited by examiner

Primary Examiner—Kevin J. Teska
Assistant Examiner—Douglas W. Sergent
(74) Attorney, Agent, or Firm—Kanesaka & Takeuchi

(57) ABSTRACT

The monitoring control apparatus according to the present invention performs a test on each integrated circuit that supports the boundary scan test method loaded on CPU board 4 and control board 5, and on the connection relationships of these integrated circuits, by a boundary scan controller board 7 like that shown, for example, in FIG. 1. If an abnormality is detected in CPU board 4 or control board 5, an alarm apparatus 9 is activated which emits an alarm. Moreover, if the type of abnormality is such that there is the risk of it having a significant effect on the operation of a robot 3, which is the target of this monitoring and control, from the viewpoint of safety, main power supply apparatus 6 of robot 3 is interrupted to prevent in advance robot 3 from running out of control.

9 Claims, 20 Drawing Sheets

Fig.17

| TAP Signal Device | Function |
|---|---|
| T D I<br>Test Data In | Signals for serial input of commands and data to test logic. Sampled at the rising edge of TCK. |
| T D O<br>Test Data Out | Signals for serial output of data from test logic. Changes in the output value of TDO occurs at the falling edge of TCK. |
| T C K<br>Test Clock | Supplies a clock to the test logic. Dedicated input enabling the serial test data path to be used independently of the system clock characteristic to each component |
| T M S<br>Test Mode Select | Signals for controlling the test operation. Sampled at the rising edge of TCK. These signals are decoded by the TAP controller. |
| T R S T<br>Test Reset | Optional negative logic signals for asynchronous initialization of test operation. TMS is in the high state, and remains in this state even in the case the rising edge of TCK is detected five times. |

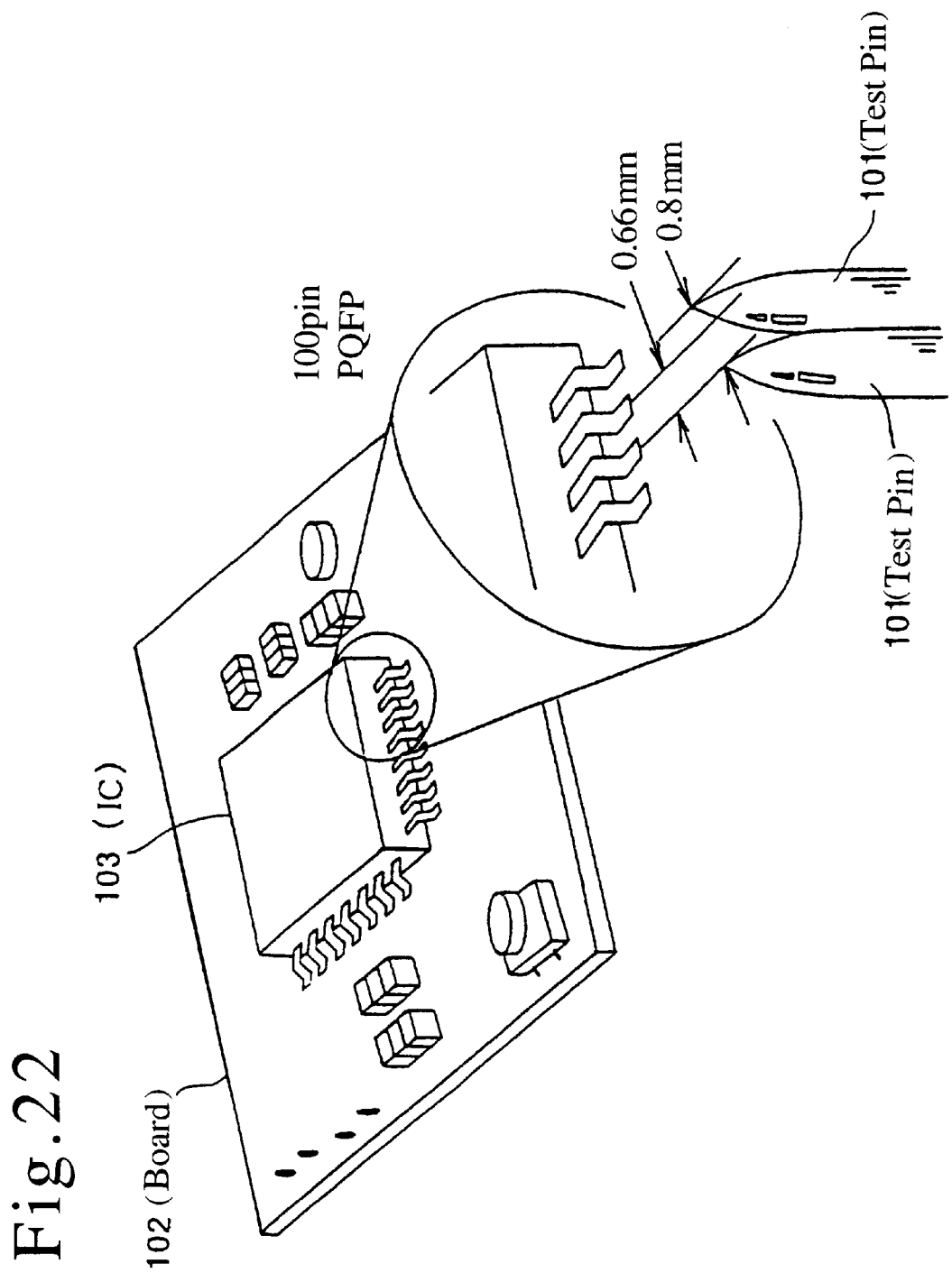

MONITORING AND CONTROL APPARATUS INCORPORATING RUN-TIME FAULT DETECTION BY BOUNDARY SCAN LOGIC TESTING

BACKGROUND OF THE INVENTION

1. Field of the Invention

The present invention relates to a monitoring control apparatus that performs monitoring and control of a robot and so forth as well as incorporation of data and so forth gathered by sensors, and more particularly, to a monitoring control apparatus that performs monitoring and control of a robot or other target of monitoring and control as well as incorporation of data and so forth while monitoring the operating status of a board that supports the boundary scan test method using a boundary scan controller board.

2. Explanation of the Prior Art

In a monitoring control apparatus that monitors and controls a robot and so forth, if a malfunction occurs for some reason in the CPU board or various types of control boards provided within the monitoring control apparatus, since the robot may run out of control or stop operating, when manufacturing the CPU board or various other types of control boards, the quality of the board is evaluated using a method such as an in-circuit test. Moreover, when monitoring and controlling a robot by assembling the CPU board or various other types of control boards as well, the quality of the various types of control boards is periodically checked by a CPU board and so forth to prevent the occurrence of problems caused by malfunctions of the hardware.

However, the most commonly employed testing method at present for inspecting the quality of each board that composes a monitoring control apparatus is the in-circuit test method in which a pin cushion or similar object like that used for inserting cut flowers is placed against the pattern surface of the board to test the printed pattern that composes each board.

However, despite increases in the number of pins due to higher levels of integration and so forth of the IC loaded on the board, packages are becoming increasingly compact due to the demand for high-density mounting and so forth. Consequently, as shown in FIG. 22, the pin interval of IC 103 loaded on board 102 (for example, 0.66 mm) is narrower than the diameter of test pin 101 (for example, 0.8 mm) used in the in-circuit test method. Thus, the number of boards 102 on which testing like that according to the in-circuit test method cannot actually be performed is increasing.

In addition, since monitoring and control of a robot is performed while checking the quality of various types of control boards and so forth by a CPU board and so forth when monitoring and controlling a robot by assembling a CPU board and various types of control boards as well, in addition to sacrificing some of the performance of the CPU board, there is the problem of the robot running out of control and so forth when some type of abnormality occurs in the CPU board and so forth.

Therefore, as a way of solving these types of problems, although a method has been proposed in which a dedicated monitoring board is provided independent from the CPU board and the operating state of the CPU board and various other types of control boards and so forth is monitored by this dedicated monitoring board, in test methods using this type of dedicated monitoring board, if the operational timing of the dedicated monitoring board is not set accurately, the monitoring operation of the dedicated monitoring board interferes with the monitoring and control operations of the CPU board and various types of control boards, which can cause the robot monitoring and control operations performed by the CPU board and various other types of control boards to stop.

In addition, in monitoring control systems that perform monitoring and control of a robot and so forth, control signals required for performing a specified operation are generated while determining the operating state of each part of the robot by incorporating signals output from various sensors provided in each part of the robot. These control signals are supplied to each actuator of the above-mentioned robot and the specified operation is performed by controlling each of these actuators.

At this time, if an abnormality occurs in any piece of hardware or software that composes the monitoring control system, since there is the risk of the robot running out of control and causing danger to persons in the surrounding areas, by testing the operating status of each part of the system with a self-check function of the CPU circuit or mutually monitoring the operation of each part of the system, including the CPU circuit, by composing a multi-CPU circuit, improper robot operation caused by abnormalities in any part of the hardware or bugs in the software can be prevented in advance.

However, in data processing systems such as the monitoring control system described above, since the presence or absence of malfunctions in devices provided in the periphery of the CPU circuit cannot be detected by a self-check function of the CPU circuit, there are many cases in which a multi-CPU circuit is composed to mutually monitor the operation of each part of the system, including the CPU circuit. When the system is composed in this manner, however, one of the plurality of CPU circuits performs monitoring and control of the robot, while the other CPU circuits only monitor the operating status within the system. Consequently, even if the number of CPU circuits is increased, robot monitoring and control performance cannot be improved while only resulting in the problem of increased system waste.

With this in mind, in order to eliminate this waste, although a monitoring control system has been proposed that periodically monitors the operating status of each part of the system while performing specified data processing by a single CPU circuit, even if this type of system configuration is employed, the only type of test method that allows the operating status of each part of the system to be checked is that which determines whether or not the correct data is read by reading and writing preset data for memory circuits and so forth provided in each part of the system by a CPU circuit.

Consequently, the operating status of each part of the system is unable to be tested in terms of individual integrated circuits provided in each part of the system or in terms of individual boards on which each of these integrated circuits is loaded. Thus, there is a strong desire to develop a monitoring control system that is able to detect operating status in terms of the individual integrated circuits provided in each part of the system or in terms of the individual boards on which each of these integrated circuits is loaded.

In addition, similar problems are found not only in these types of monitoring control systems, but also in, for example, data processing systems that perform normal data processing. Thus, there has also been a strong desire to develop a data processing system that is able to detect the operating status of each part of the system in terms of individual integrated circuits or individual boards on which each of these integrated circuits is loaded.

In addition, a type of communication system that connects each decentralized sensor module, each terminal apparatus and the host computer apparatus with a communication line is known in which a communication device is loaded on each sensor module, each terminal apparatus and within the host computer apparatus, and these communication devices are used to gather data obtained with each sensor module and so forth to set the detection conditions for each module and so forth.

However, in this type of communication system of the prior art, when the data obtained with the sensor of each sensor module is transmitted along the communication line, communication signals are generated as a result of the communication devices loaded on the sensor modules converting the above-mentioned data to be compatible with the communication protocol. These communication signals are then transmitted along the communication line. In addition, when the communication signals transmitted along the communication line from the host computer apparatus are incorporated, since the above-mentioned communication signals from the communication line are incorporated by the communication devices and converted into data which can be processed with the CPU based on the communication protocol, communication devices must be loaded on each sensor module, thus resulting in the problem in a corresponding increase in the production cost of each sensor module.

In addition, when performing serial communications between each sensor module and the host computer apparatus using this type of communication device, the data transfer rate ends up to be restricted to only several tens of Kbps so that when the data obtained from each sensor module is gathered or when setting the detection conditions for each sensor module, there is the problem of this requiring an excessive amount of time.

In consideration of the above-mentioned circumstances, the object of the present invention, in a first aspect, is to provide a monitoring control apparatus that is able to check the operating status of a CPU board and various other types of control boards and evaluate their quality while still allowing the CPU board and various other types of control boards to operate even when the CPU board and various other types of control boards have been installed.

In addition, in a second aspect, the object of the present invention is to provide a monitoring control apparatus that is able to prevent a robot and so forth controlled by this monitoring control apparatus from running out of control even when the CPU board of the monitoring control apparatus malfunctions.

In addition, in a third aspect, the object of the present invention is to provide a monitoring control apparatus that is able to test the remaining boards to determine whether or not they are normal when the CPU board and so forth of the monitoring control apparatus has malfunctioned, thereby enabling it to determine the location of the abnormality by detecting the malfunction even if a plurality of boards malfunctions simultaneously.

In addition, in a fourth aspect, the object of the present invention is to provide a monitoring control apparatus that is able to switch the priority of a boundary scan controller board even if a boundary scan controller board is installed for the CPU board and control board, thereby enabling it to switch off the boundary scan controller board when a boundary scan test by the above-mentioned boundary scan controller board is not necessary.

In addition, in a fifth aspect, the object of the present invention is to provide a data processing system that is able to detect the operating status of each part of a system in terms of individual integrated circuits or in terms of individual boards on which each of these integrated circuits is loaded, thereby enabling it to prevent the occurrence of problems caused by hardware malfunctions or software bugs in advance.

In addition, in a sixth aspect, the object of the present invention is to provide a data processing system that is able to detect the operating status of each part of the system in terms of individual integrated circuits or in terms of individual boards on which each of these integrated circuits is loaded without making the operator aware of the presence of a boundary scan test driver, thereby enabling it to prevent the occurrence of problems caused by hardware malfunctions or software bugs in advance.

In addition, in a seventh aspect, the object of the present invention is to provide a data processing system that is able to perform an operational check of the CPU, status check of the I/O ports, status checks of various controllers, detection and correction of erroneous data and so forth, thereby enabling it to prevent the occurrence of problems caused by hardware malfunctions and software bugs in advance.

In addition, in eigth and ninth aspect, the object of the present invention is to provide a communication system that is able to connect various sensors and terminal apparatuses with a host computer apparatus without using a communication device, thereby enabling it to reduce the production cost of the overall system while also dramatically shortening the time required when gathering data obtained from each sensor module and each terminal apparatus or when setting detection conditions and data for each sensor module and each terminal apparatus by increasing the data transfer rate between the host computer apparatus and each sensor module and terminal apparatus and so forth up to a maximum of roughly 20 Mbps.

DISCLOSURE OF THE INVENTION

In order to achieve the above-mentioned objects, the present invention, in the first aspect, discloses a monitoring control apparatus that performs monitoring and control of a monitoring and control target by using a CPU board and various types of boards; wherein, by electrically connecting a board on which is loaded components that support the boundary scan test method and a boundary scan controller board and performing the boundary scan test of the above-mentioned board by the above-mentioned boundary scan controller board to test the above-mentioned board or each component loaded on said board, the operating status of the CPU board or various types of control boards is checked to evaluate their quality with the CPU board and various types of control boards still operating even if the CPU board and various types of control boards have been installed. In addition, in the second aspect, the present invention discloses the monitoring control apparatus described in the first aspect wherein, by making the power supply apparatus of said boundary scan controller board and the power supply apparatus of said board independent, and performing a boundary scan test on said board by said boundary scan controller board to test said board or each component loaded on said board, the robot and so forth controlled by this monitoring control apparatus does not run out of control even if the CPU board and so forth of this monitoring control apparatus malfunctions.

In addition, in the third aspect, the present invention discloses the monitoring control apparatus described in either the first or second aspect wherein, by connecting said boundary scan controller board to each board using a dedicated line provided for each of said boards and performing a boundary scan test on each of these boards, the monitoring control apparatus is able to test whether or not the remaining boards are normal even if the CPU board of any of the various types of control boards malfunction, enabling it to detect the location of an abnormality, even if a plurality of boards simultaneously malfunction, by detecting that malfunction.

In addition, in the fourth aspect, the present invention discloses the monitoring control apparatus described in any of the second of third aspect wherein, by controlling the execution and interruption of execution of the boundary scan test by said boundary scan controller board based on the operation of an enable/disable switch provided on said boundary scan controller board, the priority of said boundary scan controller board is switched even if said boundary scan controller board is installed, enabling said boundary scan control test performed by said boundary scan controller board to be turned off when not required.

In addition, in the fifth aspect, the present invention discloses a data processing system that performs designated processing while controlling the operation of each part of the system by a CPU circuit; wherein, by connecting a board, which is loaded with an integrated circuit that supports the boundary scan test method and composes each part of the system, and a CPU circuit board with a system bus that supports the boundary scan test method, and performing the boundary scan test on each board or on each integrated circuit loaded on each board by a boundary scan test driver or a boundary scan test task by means of said system bus, the operating status of each part of the system can be detected in terms of individual integrated circuits or in terms of individual boards on which each integrated circuit is loaded, enabling the data processing system to prevent the occurrence of problems caused by a hardware malfunction or software bugs in advance. In addition, in the sixth aspect, the present invention discloses the data processing system described in the fifth aspect wherein, by incorporating said boundary scan test driver or boundary scan test task in the OS or application software that defines the operation of said CPU circuit, the operating status of each part of the system is detected in terms of individual integrated circuits or in terms of individual boards on which each said integrated circuit is loaded without the operator being aware of the presence of the boundary scan test driver, enabling the data processing system to prevent the occurrence of problems caused by a hardware malfunction or software bugs in advance.

In addition, in the seventh aspect, the present invention discloses the data processing system described in either the fifth or sixth aspect wherein, by giving said boundary scan test driver or boundary scan test task at least one of any of the functions consisting of a function that checks the operation of the CPU, a function that checks the status of the I/O ports, a function that checks the status of each type of controller and a function that detects and corrects erroneous data, it checks the operation of the CPU, checks the status of the I/O ports, checks the status of each type of controller, detects and corrects erroneous data and so forth, enabling the data processing system to prevent the occurrence of problems caused by a hardware malfunction of software bugs in advance.

In addition, in the eighth aspect, the present invention discloses a communication system having a function that transfers serial data to a plurality of decentralized electronic devices, and a function that transfers serial data from each of said electronic devices; wherein, by arranging a boundary scan element having a boundary scan test function within each of said electronic devices and using the serial data input/output function of this boundary scan element to perform incorporation and output of serial data, each sensor module and each terminal apparatus and so forth can be connected with a host computer apparatus and so forth without using a communication device, which together with decreasing the production cost of the overall system, dramatically shortens the time required when gathering data obtained from each sensor module and each terminal apparatus or when setting detection conditions and data for each sensor module and each terminal apparatus by increasing the data transfer rate between the host computer apparatus and each sensor module and terminal apparatus and so forth up to a maximum of roughly 20 Mbps.

In addition, in the ninth aspect, the present invention discloses the communication system described in the eighth aspect wherein, by connecting each of said electronic devices with optic fiber cable, and using optical signals for the serial data transferred between the respective electronic devices, each sensor module and each terminal apparatus and so forth can be connected with a host computer apparatus and so forth without using a communication device, which together with decreasing the production cost of the overall system, dramatically shortens the time required 20 when gathering data obtained from each sensor module and each terminal apparatus or when setting detection conditions and data for each sensor module and each terminal apparatus by increasing the data transfer rate between the host computer apparatus and each sensor module and terminal apparatus and so forth up to a maximum of roughly 20 Mbps in the same manner as in the eighth aspect.

BRIEF DESCRIPTION OF THE DRAWINGS

FIG. 17 is a table showing examples of control of the TDI terminal, TDO terminal, TCK terminal, TMS terminal and TRST terminal provided in the integrated circuit shown in FIG. 16.

FIG. 22 is a perspective view showing a test example of a board and the integrated circuit loaded on the board using the in-circuit test method as performed in the prior art.

BASIC PRINCIPLE OF THE INVENTION

To begin with, before providing a detailed explanation of the monitoring control apparatus according to the present invention, the following provides an explanation of the boundary scan test method that serves as the basic principle of the present invention.

Figure 16:
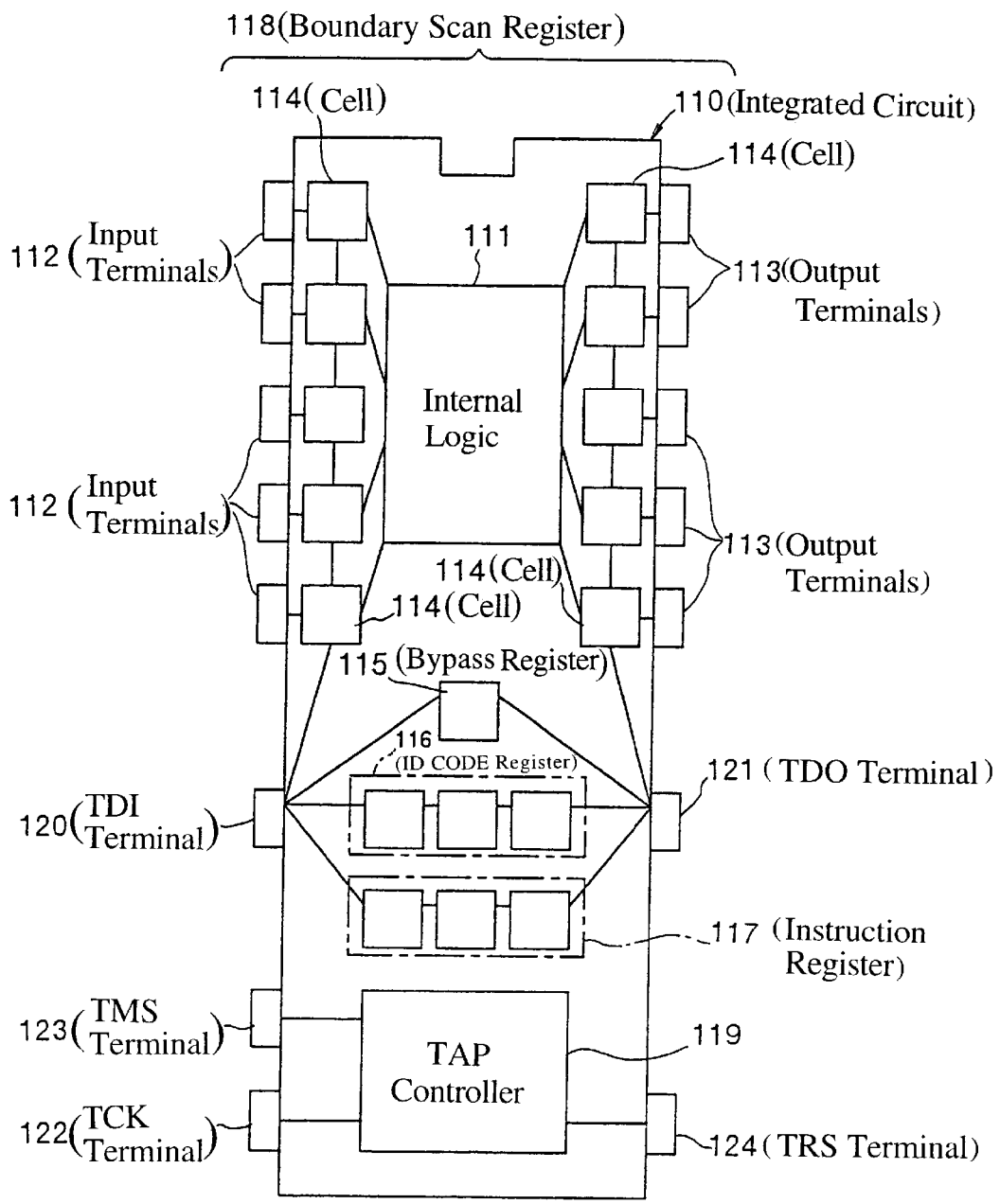
FIG. 16. is a block diagram showing an example of an integrated circuit that supports the boundary scan test method used in the monitoring control apparatus according to the present invention.

The boundary scan test method used in the present invention is a method for testing the operating state of an integrated circuit (IC chip) that supports this test method and the connection relationship between this integrated circuit and external devices, an example of this integrated circuit being integrated circuit 110 as shown in FIG. 16 provided with input and output terminals of internal logic circuit 111, which demonstrates the inherent functions of integrated circuit 110, cells 114 provided between input terminals 112 and output terminals 113 and corresponding to a one-to-one basis with these input terminals 112 and output terminals 113, bypass register 115, IDCODE register 116, command register 117 and so forth, and TAP controller 119 that controls boundary scan register 118 composed of these cells 114 and bypass register 115 through command register 117. This boundary scan test method performs a test on integrated circuit 110 according to the procedure described below.

First, during a quality check of integrated circuit 110 itself, TDI terminal 120, TDO terminal 121, TCK terminal 122, TMS terminal 123 and TRST terminal 124 are controlled as shown in FIG. 17. While inputting serial data (test data) to TDI terminal 120 of integrated circuit 110, this input of data is shifted so that test data is set in each cell 114 corresponding to each input terminal 112. While in this state, the data set in each cell 114 corresponding to each output terminal 113 is shifted after operating integrated circuit 110. Data inherently output from each output terminal 113 is thus output from TDO terminal 121 of integrated circuit 110. As a result, the quality of internal logic 111 of integrated circuit 110 can be determined based on the corresponding relationship between the resulting serial data (test result data) and the test data input to this integrated circuit 110.

Figure 18:
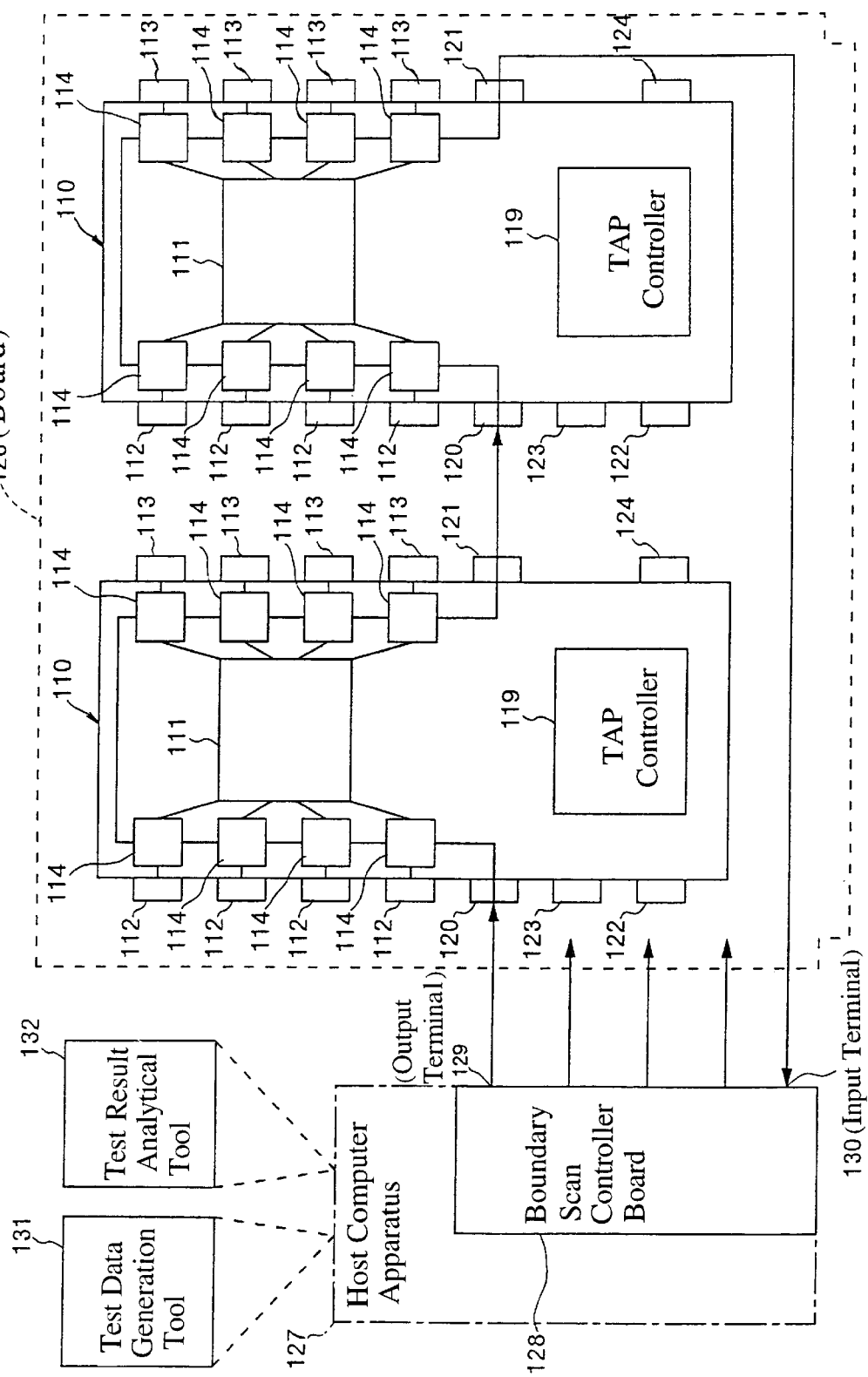
FIG. 18 is a block diagram showing an example of a boundary scan test for a board using a plurality of the integrated circuits shown FIG. 16.

In addition, when connecting a plurality of integrated circuits 110 that support this type of boundary scan test method by using the printed pattern formed in, for example, board 126 as shown in FIG. 18, together with connecting TDO terminal 121 of the first integrated circuit 110 with TDI terminal 120 of the second integrated circuit 110, output terminal 129 of boundary scan controller board 128 provided on, for example, host computer apparatus 127 is connected with TDI terminal 120 of the first integrated circuit 110, and input terminal 130 of boundary scan controller board 128 is connected with TDO terminal 121 of the second integrated circuit 110.

Figure 19:
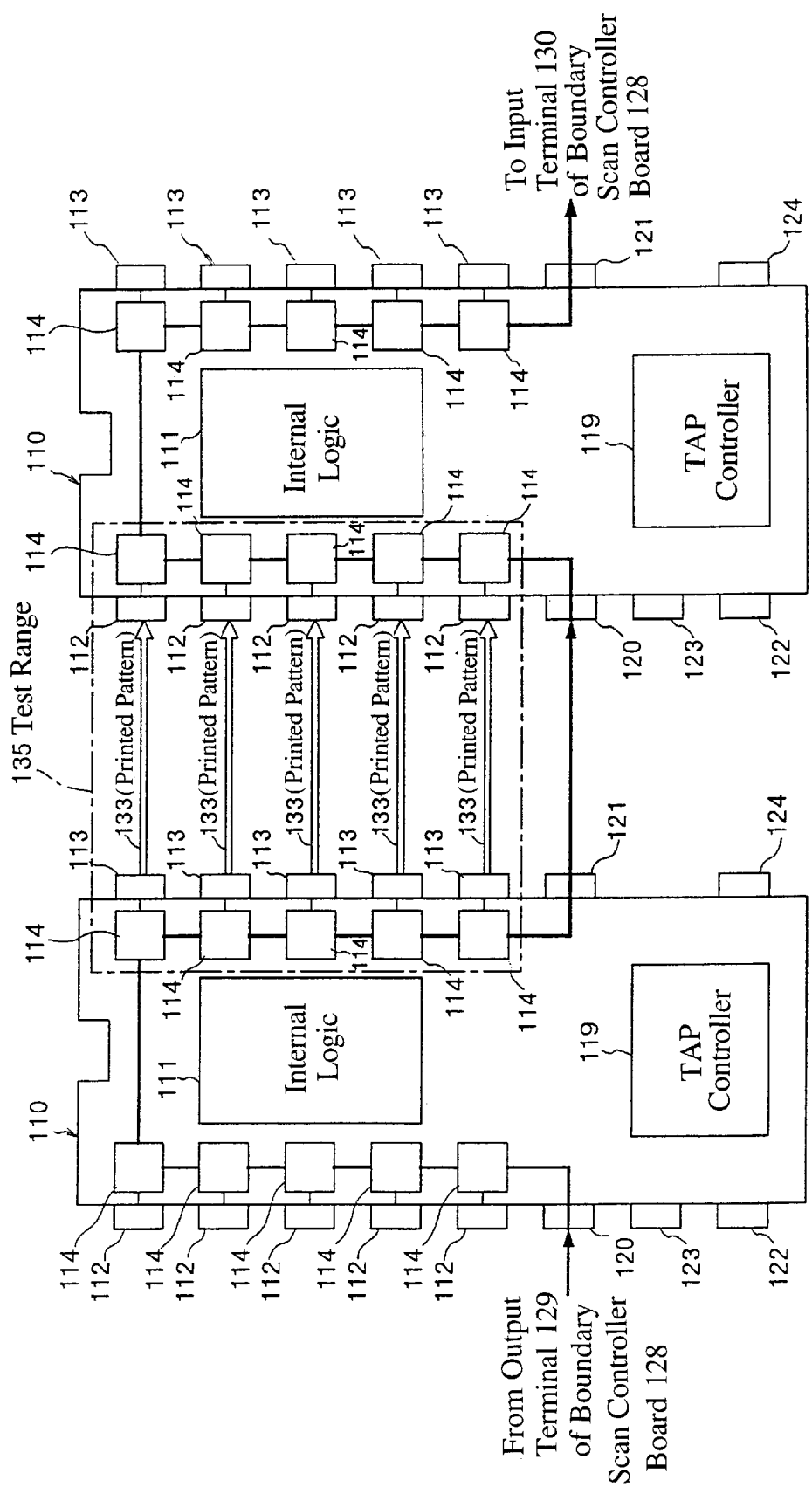
FIG. 19 is a schematic drawing showing an operation example during testing of the connections of each integrated circuit loaded on the board shown in FIG. 18 using the boundary scan test.

Test data (serial data) is then generated using, for example, test data generation tool 131, this data is output to output terminal 129 of boundary scan controller board 128, and this data is then shifted while inputting to TDI terminal 120 of the first integrated circuit 110 to set in each cell 114 corresponding to each output terminal 113 of integrated circuit 110. While in this state, together with outputting the data housed in each of these cells 114 from each output terminal 113 provided in the first integrated circuit 110 as shown in FIG. 19, this data is input to each input terminal 112 of the second integrated circuit 110 through each printed pattern 133 that composes the system bus and so forth, and incorporated in each cell 114 corresponding to each of these input terminals 112.

Next, the data housed in each cell 114 of each of these integrated circuits 110 is shifted, and by analyzing the data using, for example, test result analytical tool 132 while incorporating the data at input terminal 130 of boundary scan controller board 128, test range 135 of printed pattern 133 and so forth that connects each of these integrated circuits 110 can be tested to determine if it is normal or not.

Figure 20:
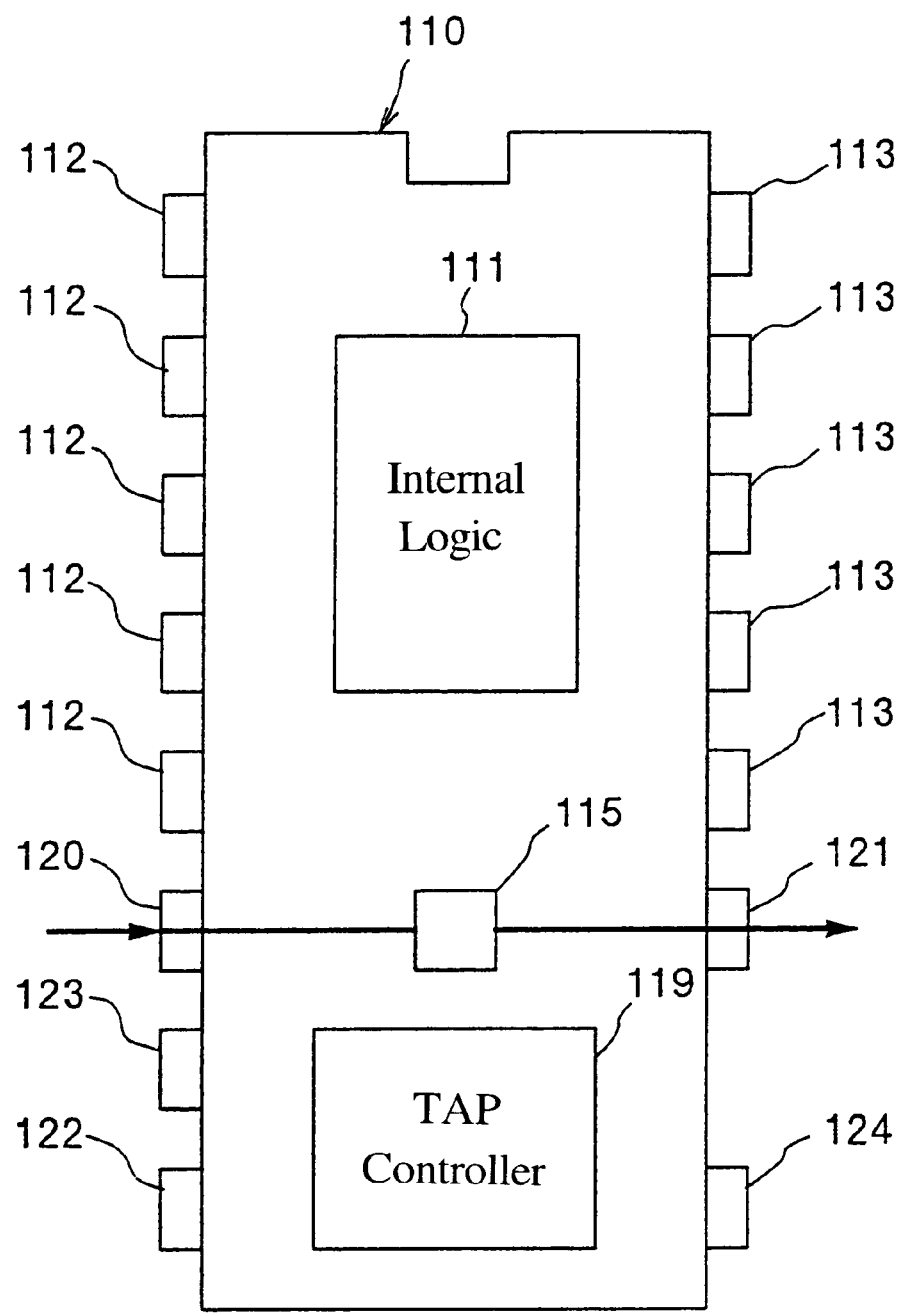
FIG. 20 is a schematic drawing showing an operation example during individual testing of each integrated circuit loaded on the board shown FIG. 18 using the boundary scan test.
Figure 21:
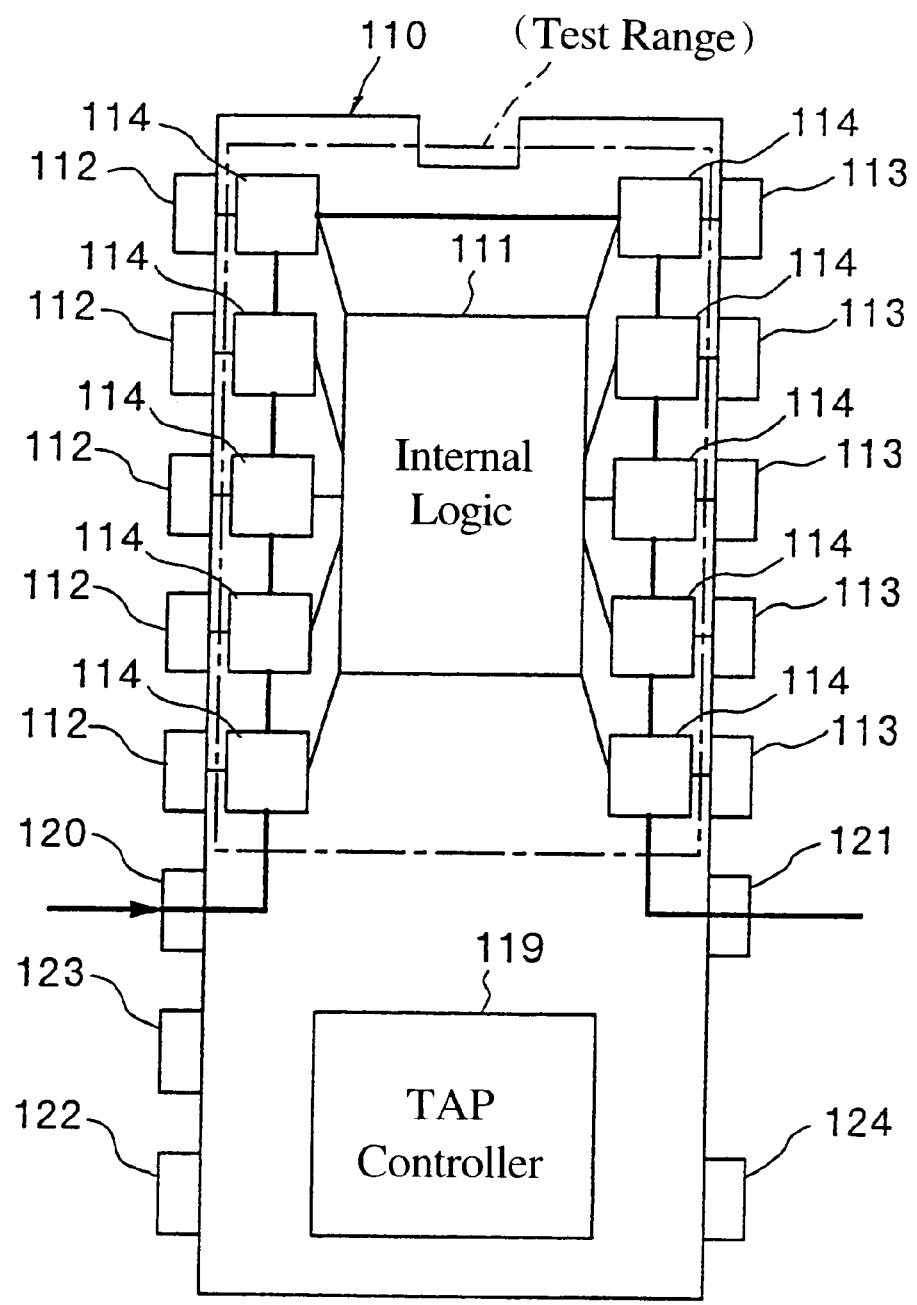
FIG. 21 is a schematic drawing showing an operation example during individual testing of each integrated circuit loaded on the board shown FIG. 18 using the boundary scan test.

In addition, as shown in FIG. 20, after bypassing the second integrated circuit 110 by boundary scan controller board 128, test data generated using, for example, test data generation tool 131 is output from output terminal 129 of boundary scan controller board 128. This test data is then shifted while inputting to TDI terminal 120 of the first integrated circuit 110 and set in each cell 114 corresponding to each input terminal 112 of this integrated circuit 110 as shown in FIG. 21. Next, this integrated circuit 110 is operated, and after incorporating the resulting data into each cell 114 corresponding to each output terminal 113, the data housed in each of these cells 114 is shifted, and together with outputting from TDO terminal 121 of the first integrated circuit 110, the second integrated circuit 110 is bypassed. While incorporating this data at input terminal 130 of boundary scan controller board 128, the data is analyzed using, for example, test result analytical tool 132 to test whether or not the first integrated circuit 110 is operating properly.

Similarly, as shown in FIG. 20, after bypassing the first integrated circuit 110 by boundary scan controller board 128, test data generated using, for example, test data generation tool 131 is output from output terminal 129 of boundary scan controller board 128, and with the first integrated circuit 110 in the bypassed state, the data is shifted while inputting to TDI terminal 120 of the second integrated circuit 110, and set in each cell 114 corresponding to each input terminal 112 of this integrated circuit 110 as shown in FIG. 21. Next, this integrated circuit 110 is operated, and after incorporating the resulting data in each cell 114 corresponding to each output terminal 113, the data housed in each of these cells 114 is shifted. While incorporating this data at input terminal 130 of boundary scan controller board 128, the data is analyzed using, for example, test result analytical tool 132 to test whether or not the second integrated circuit 110 is operating properly.

In this manner, the quality of each integrated circuit 110 itself and the connection relationship between the integrated circuits 110 can be tested in the case of board 126 that uses integrated circuit 110 which supports the boundary scan test method.

By incorporating board 126 that uses integrated circuit 110 which supports the boundary scan test method for each of the boards of the monitoring control apparatus, the present invention is able to test the CPU board and each control board installed in the monitoring control apparatus by using the boundary scan test method. If there is any abnormality in the CPU board or any of the control boards, a description of the abnormality is notified to a host computer apparatus or the main power of a robot controlled by the monitoring control apparatus is cut off to prevent the robot from running out of control.

Composition of the Embodiment of a Monitoring Control Apparatus

The following provides a detailed explanation of the present invention based on its embodiments shown in the drawings.

Figure 1:
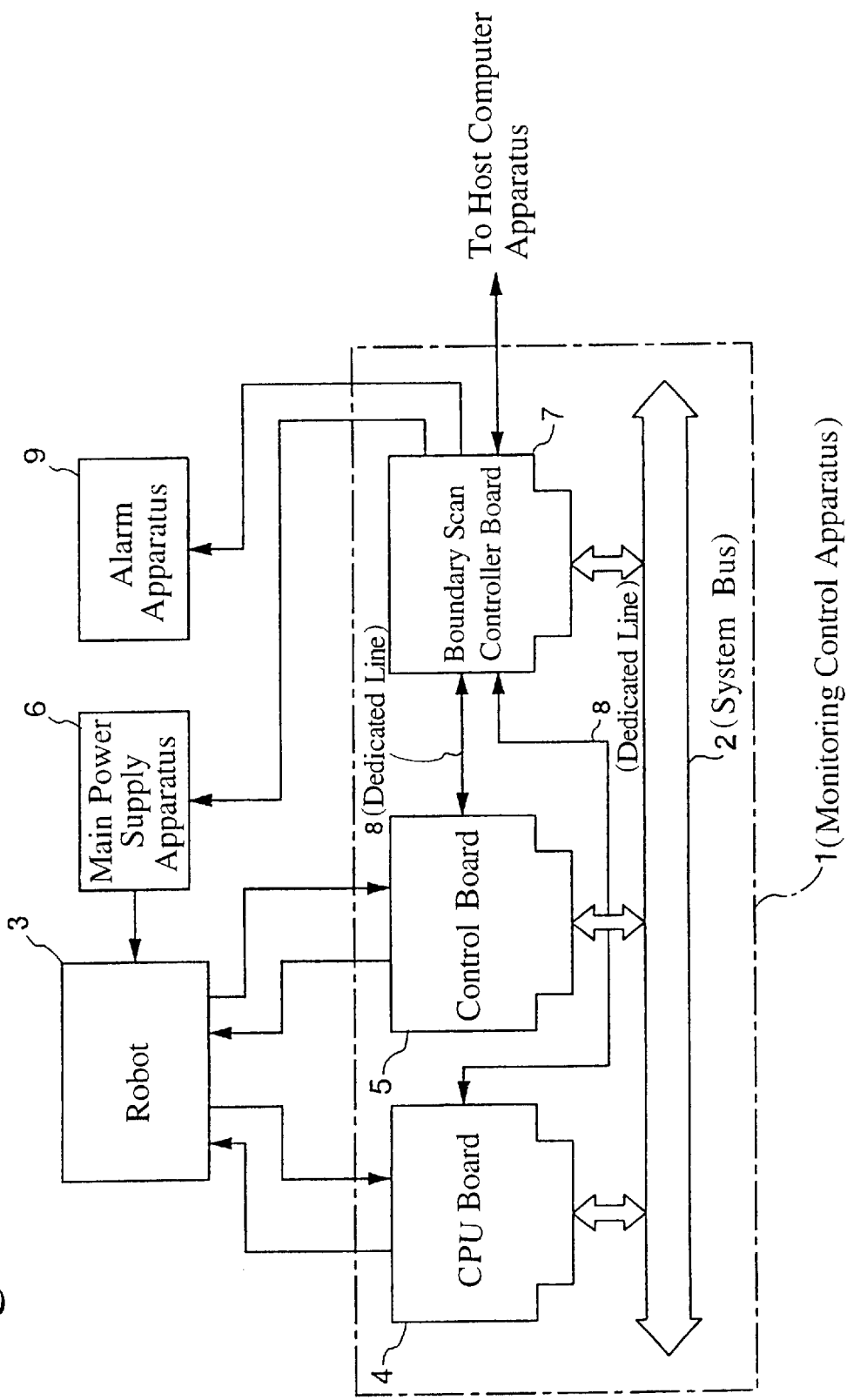
FIG. 1 is a block diagram showing one embodiment of the monitoring control apparatus according to the present invention.

FIG. 1 is a block diagram showing one embodiment of the monitoring control apparatus according to the present invention that uses the basic principle described above.

The monitoring control apparatus shown in this drawing is equipped with CPU board 4, which monitors and controls a robot 3, for example, which is the target of monitoring and control, is loaded with an integrated circuit that supports the boundary scan test method, and is connected to system bus 2 composed of a PCI bus and so forth; control board 5, which is loaded with an integrated circuit that supports the boundary scan test method, is connected to the above-mentioned CPU board 4 by means of the above-mentioned system bus 2, and monitors or controls the above-mentioned robot 3 and so forth based on the control contents of the above-mentioned CPU board 4; boundary scan controller board 7, which performs the boundary scan test on the above-mentioned CPU board 4, control board 5 and so forth using the power supply voltage supplied from the above-mentioned system bus 2, informs a host computer apparatus of the contents of an abnormality or cuts off main power supply apparatus 6 of the above-mentioned robot 3 when an abnormality occurs in CPU board 4 or control board 5 and so forth; and, dedicated line 8, which respectively connects this boundary scan controller board 7 with the above-mentioned CPU board 4 and control board 5.

If there is an abnormality in CPU board 4 or control board and so forth as a result of testing each integrated circuit itself that supports the boundary scan test method loaded on CPU board 4 and control board 5 by means of dedicated line 8 and testing the connection relationship between these integrated circuits by boundary scan control board 7, together with notifying a description of the abnormality to a host computer apparatus, alarm apparatus 9 is activated which outputs an alarm. Moreover, if the contents of the abnormality are such that there is the risk of a significant effect on the operation of the target of monitoring and control in the form of robot 3, from the viewpoint of a fail-safe mechanism, main power supply apparatus 6 of the above-mentioned robot 3 is cut off to prevent in advance robot 3 from running out of control.

Figure 2:
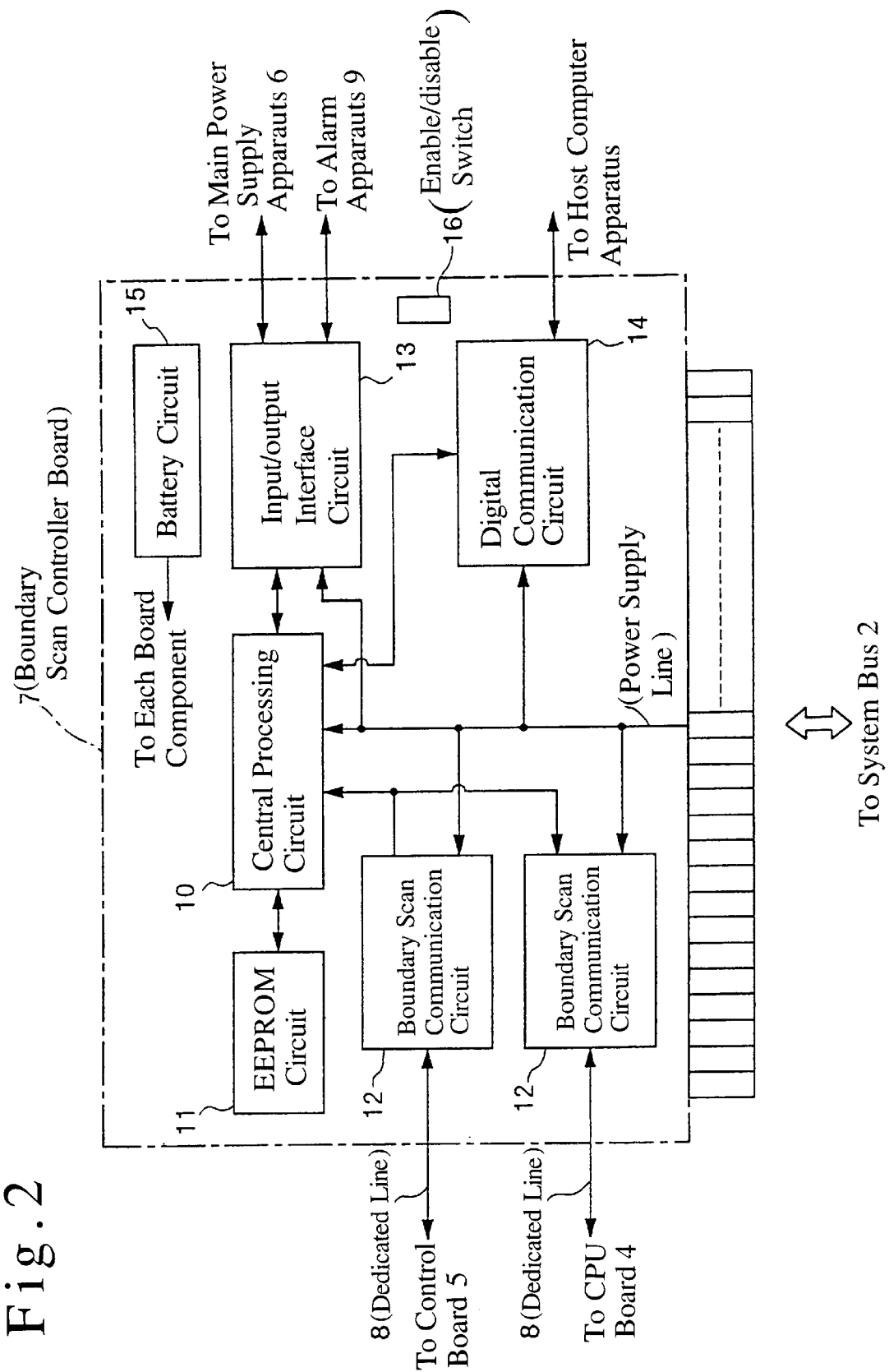
FIG. 2 is a block diagram showing a detailed circuit configuration example of the boundary scan controller board shown in FIG. 1.

In this case, as shown in FIG. 2, the above-mentioned boundary scan controller board 7 is equipped with central processing circuit 10, which is composed of a microprocessor and so forth that operates using the power supply voltage supplied from the power line of the above-mentioned system bus 2, and which performs various types of data processing necessary for the boundary scan test; EEPROM circuit 11, which serves the storage location of data and so forth used in this central processing circuit 10, the reading and writing of which are performed by the above-mentioned central processing circuit 10; and a plurality of boundary scan communication circuits 12, which operate using the power supply voltage supplied from the power line of the above-mentioned system bus 2, and performs the boundary scan test on each of the above-mentioned CPU board 4 and control board 5 by means of each dedicated line 8 based on various commands output from the above-mentioned central processing circuit 10.

Moreover, this boundary scan controller board 7 is also equipped with input/output interface circuit 13, which is composed of digital I/O, relays or switches and so forth, operates by using the power supply voltage supplied from the power line of the above-mentioned system bus 2, and electrically connects the on/off circuits and so forth of alarm apparatus 9 and the above-mentioned main power supply apparatus 6; digital communication circuit 14, which operates by using the power supply voltage supplied from the power line of the above-mentioned system bus 2, and supports communications between the above-mentioned central processing circuit 10 and a host computer apparatus and so forth; backup battery circuit 15, which supplies power supply voltage to the above-mentioned central processing circuit 10 through digital communication circuit 14 and so forth when the supply of power supply voltage from the above-mentioned system bus 2 is interrupted; and enable/disable switch 16, which is set to the off state when not desiring to operate this boundary scan control board 7.

When each boundary scan communication circuit 12 is operated by central processing circuit 10 based on the commands from the host computer apparatus, the boundary scan test is performed on CPU board 4, control board 5 and so forth, and an abnormality is detected as a result of analyzing the resulting data, together with notifying the host computer apparatus of the contents of the abnormality, an alarm is emitted from alarm apparatus 9. Moreover, if the contents of the abnormality are such that there is the risk of a significant effect on the operation of robot 3, from the viewpoint of a fail-sale mechanism, main power supply apparatus 6 that supplies power to the above-mentioned robot 3 is switched off to prevent in advance robot 3 from running out of control.

Operation of an Embodiment of a Monitoring Control Apparatus

Next, an explanation of the operation of this embodiment is provided while referring to the block diagrams shown in FIG. 1 and FIG. 2.

Figure 3:
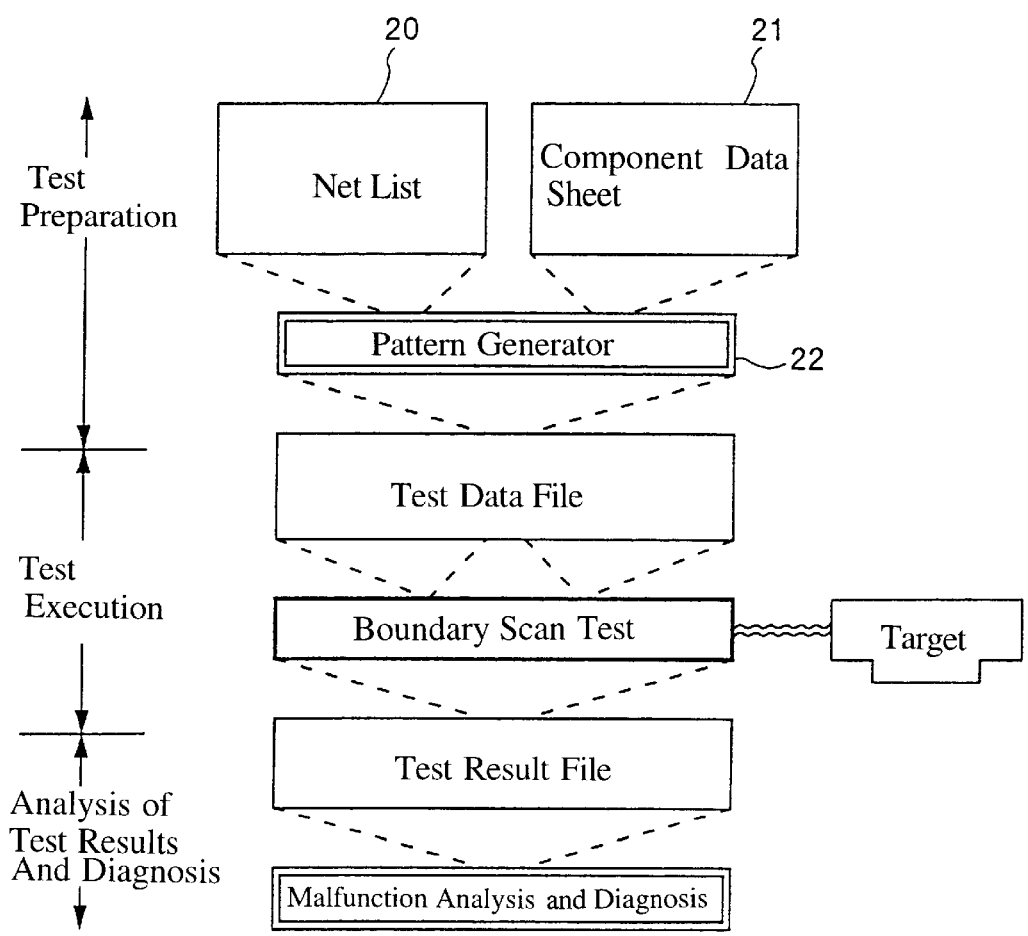
FIG. 3 is a schematic drawing showing an operational example of the boundary scan test performed by the boundary scan controller board shown in FIG. 1.

To begin with, as shown in FIG. 3, before operating monitoring control apparatus 1, pattern generator 22 is started by the host computer apparatus, and test data is generated for checking the operating status of each integrated circuit, the connections of the cables and so forth that compose monitoring control apparatus 1 and the contents of the printed pattern based on component data sheet 21 of each of the above-mentioned integrated circuits used in CPU board 4 and control board 5 and on net list 20 used when designing monitoring control apparatus 1. Together with this being filed in test data file 23, the analytical data required for evaluating the test results is generated and filed.

Next, if enable/disable switch 16 is set to the enable position, communication takes place between central processing circuit 10 and the host computer apparatus by means of digital communication line 14. Together with new test data and analytical data filed in the host computer apparatus being supplied, this data is incorporated by central processing circuit 10 to update the test data and analytical data stored in EEPROM circuit 11.

When monitoring and control of robot 3 is performed by monitoring control apparatus 1, the test data stored in the above-mentioned EEPROM circuit 11 is read by central processing circuit 10. Together with this data being set in each boundary scan communication circuit 12, the above-mentioned test data is supplied to CPU board 4 and control board 5 by means of each dedicated line 8. Together with then testing the operating status of each integrated circuit itself and the connection status of each integrated circuit loaded on CPU board 4 and control board 5 with the boundary scan test, the data obtained from this test (test result data) is incorporated after which, and after that, the test results are analyzed using the analytical data stored in EEPROM circuit 11 by central processing circuit 10.

In addition, when robot 3 is being monitored and controlled by monitoring control apparatus 1, each boundary scan communication circuit 12 is controlled by central processing circuit 10. Together with input/output data of each integrated circuit loaded on CPU board 4 and control board 5 being incorporated, each test result is analyzed by using the analytical data stored in EEPROM circuit 11.

If any abnormality is discovered in each of these test results, in addition to digital communication circuits 12 being controlled by central processing circuit 10 to inform the host computer apparatus of the contents of the abnormality, input/output interface circuit 13 is controlled so that an alarm is emitted from alarm apparatus 9 to inform the user and so forth of the occurrence of an abnormality in monitoring control apparatus 1. Moreover, if the contents of the abnormality are such that there is a risk of having a significant effect on the control of robot 3, the on/off circuit of main power supply apparatus 6 that supplies power to the above-mentioned robot 3 is controlled so that this main power supply apparatus 6 is cut off causing robot 3 to stop.

In addition, if enable/disable switch 16 is set in the disable position, the boundary scan test that uses boundary scan controller board 7 is stopped even if boundary scan controller board 7 is connected to system bus 2, and the normal test method of CPU board 4, such as a test according to a self-check, is performed to determine whether or not there is an abnormality in CPU board 4 itself and control board 5 and so forth.

Effect of an Embodiment of a Monitoring Control Apparatus

Since a boundary scan test is performed on CPU 4, control board 5 and so forth which support the boundary scan test method by boundary scan controller board 7 in this embodiment in the manner described above, the effects described below are obtained.

Firstly, even if a boundary scan test circuit is provided on various types of electronic circuit boards used in monitoring control apparatus 1 of robot 3, although this is used and finishes its service life in the inspection process during board production in normal modes of use, in this embodiment, the boundary scan test circuit remaining on CPU board 4 and control board 5 can be used simply by connecting boundary scan controller board 7 to system bus 2. Consequently, the operation of robot 3 can be monitored and controlled without adding a new monitoring circuit and so forth even during operation of CPU board 4 and control board 5 that perform monitoring and control of robot 3.

In addition, although monitoring control apparatus 1 of robot 3 is also equipped with a function that monitors and controls the operation of robot 3, when both control and monitoring are performed with the same processing apparatus, safety and reliability are not very good. In contrast, in this embodiment, since data input and output to each integrated circuit loaded on CPU board 4, control board 5 and so forth are monitored by boundary scan controller board 7 to monitor the operating status of robot 3, even if the monitoring of robot 3 by CPU board 4 and so forth becomes lax, robot 3 can be controlled while reliably monitoring its operating status. At this time, since monitoring by CPU board 4 and control board 5 of robot 3 serving as the single target of monitoring does not interfere with monitoring by boundary scan controller board 7, monitoring and control can be performed efficiently.

In addition, since a constitution is employed in which only the power line of system bus 2 is connected to boundary scan controller board 7, and the power supply voltage of system bus 2 is supplied only to boundary scan controller board 7, boundary scan controller board 7 can be operated by using a dedicated connector and a portion of system bus 2. Consequently, a boundary scan test can be performed on CPU 4 and control board 5 and so forth simply by installing boundary scan controller board 7 not only in the case of a monitoring control apparatus 1 that uses a system bus in which a dedicated pin is assigned for the boundary scan test, such as an expansion VM3 bus or PCI bus commonly used as the monitoring control apparatus 1 of robot 3, but also in the case of a system bus in which a dedicated pin is not assigned for a boundary scan test in this manner.

At this time, since battery circuit 15 is loaded on boundary scan controller board 7 to back up central processing circuit through digital communication circuit 14 and so forth loaded on this boundary scan controller board 7, even if the power supply of monitoring control apparatus 1 is cut off, processing required to ensure the safety of robot 13 can be performed, such as by continuing to allow boundary scan controller board 7 to operate, shutting down main power supply apparatus 6, and manipulating the starting commands of other control apparatuses.

In addition, since a plurality of boundary scan communication circuits 12 is loaded on boundary scan control board 7, and CPU board 4, control board 5 and so forth are connected individually to these boundary scan communication circuits 12 by each dedicated line 8, even if one of the integrated circuits loaded on CPU board 4, control board 5 and so forth malfunctions and no longer operates, the operating status of the other integrated circuits can be determined by performing the boundary scan test so that even if either CPU board 4, control board 5 and so forth does not operate perfectly, the other boards that are operating can be monitored using the boundary scan test.

At this time, if dedicated line 8 and boundary scan communication circuits 12 are provided in function block units (e.g., control shaft units) instead of individual CPU board 4 and control board 5, even if any of the integrated circuits does not operate perfectly, damage can be minimized, which together with allowing the performing of effective monitoring, facilitates the development of monitoring programs.

In addition, even when the detection results obtained from the boundary scan test are not abnormal, since the detection results are notified to those necessary locations such as the host computer apparatus and central monitoring room by means of digital communication line 14, together with being able to use the detection results as a part of the monitoring display information, these detection results can also be accumulated and used as useful maintenance information.

In addition, in the case there is the risk of dangerous operation or the output of erroneous data when some type of abnormality has occurred in robot 3 body and monitoring control apparatus 1, model data having a high degree of safety is output from boundary scan controller board 7, the above-mentioned model data is set in each cell corresponding to the output terminals of each integrated circuit loaded on CPU board 4 and control board 5, and this data is given priority over data that is output from the logic circuit within each integrated circuit, and output from the output terminal of each integrated circuit. Thus when a serious problem occurs in an integrated circuit and there is the risk of robot 3 entering a dangerous state, robot 3 can be prevented from performing abnormal operation by incorporating the integrated circuit in which the problem occurred along with the output of this integration circuit to prevent the abnormal data from being output from the integrated circuit performing the processing.

Moreover, when this type of processing cannot be performed, since together with an alarm (such as an indicator lamp) being emitted from alarm apparatus 9 by boundary scan controller board 7, main power supply apparatus 6 of the above-mentioned robot 3 being cut off, and the motor power supply is shut down, even if a malfunction occurs in any of the integrated circuits loaded on CPU board 4 and control board 5 and they no longer operate perfectly, robot 3 is prevented from engaging in dangerous operation.

Another Embodiment of a Monitoring Control Apparatus

Figure 4:
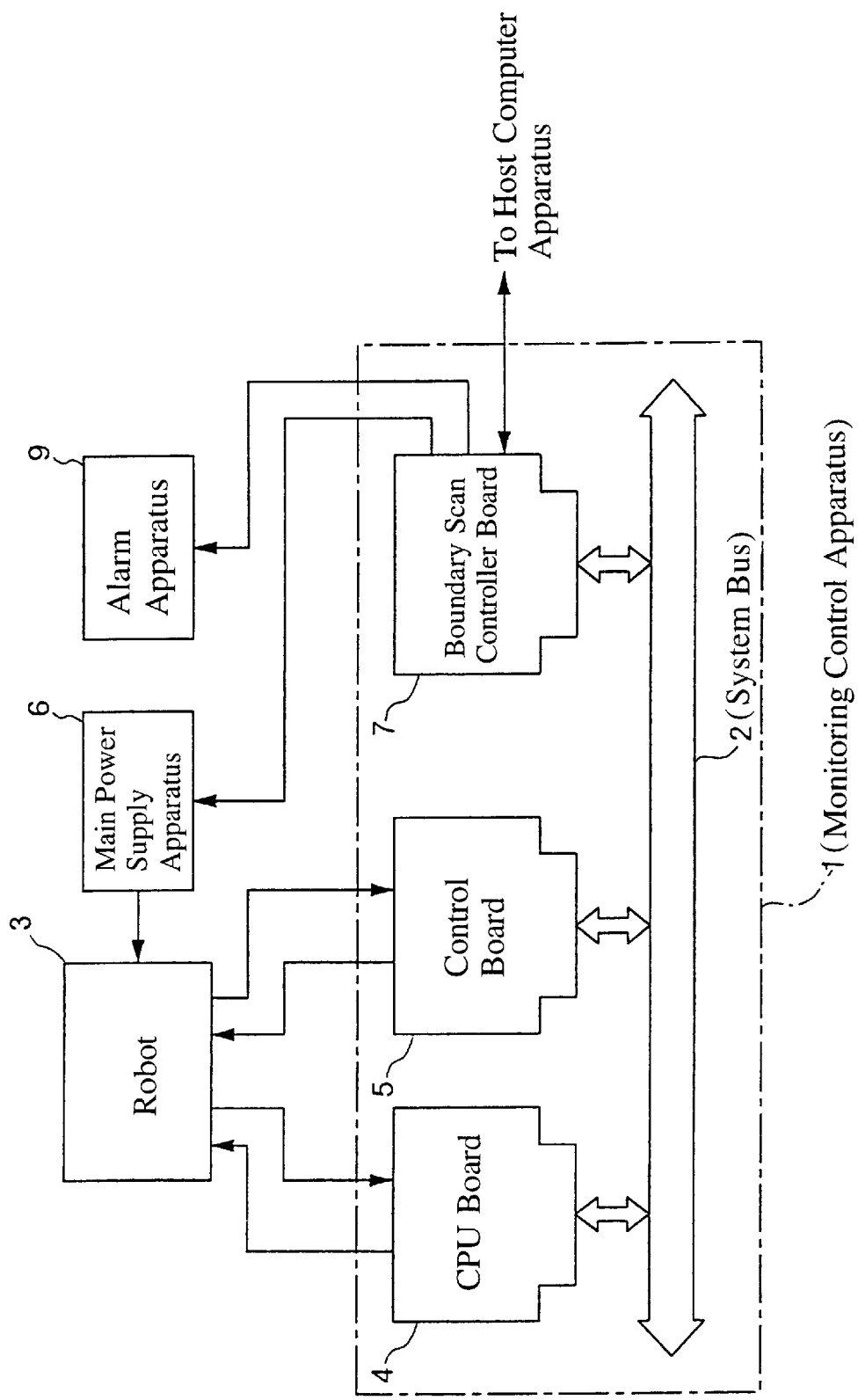
FIG. 4 is a block diagram showing another embodiment of the monitoring control apparatus according to the present invention.

In addition, although boundary scan controller board 7 is connected to CPU board 4 and control board 5 by dedicated line 8 in the above-mentioned embodiment, as shown in FIG. 4, boundary scan controller board 7, CPU board 4 and control board 5 may also be connected by boundary scan test pins assigned to system bus 2 composed of a PCI bus and so forth.

Figure 5:
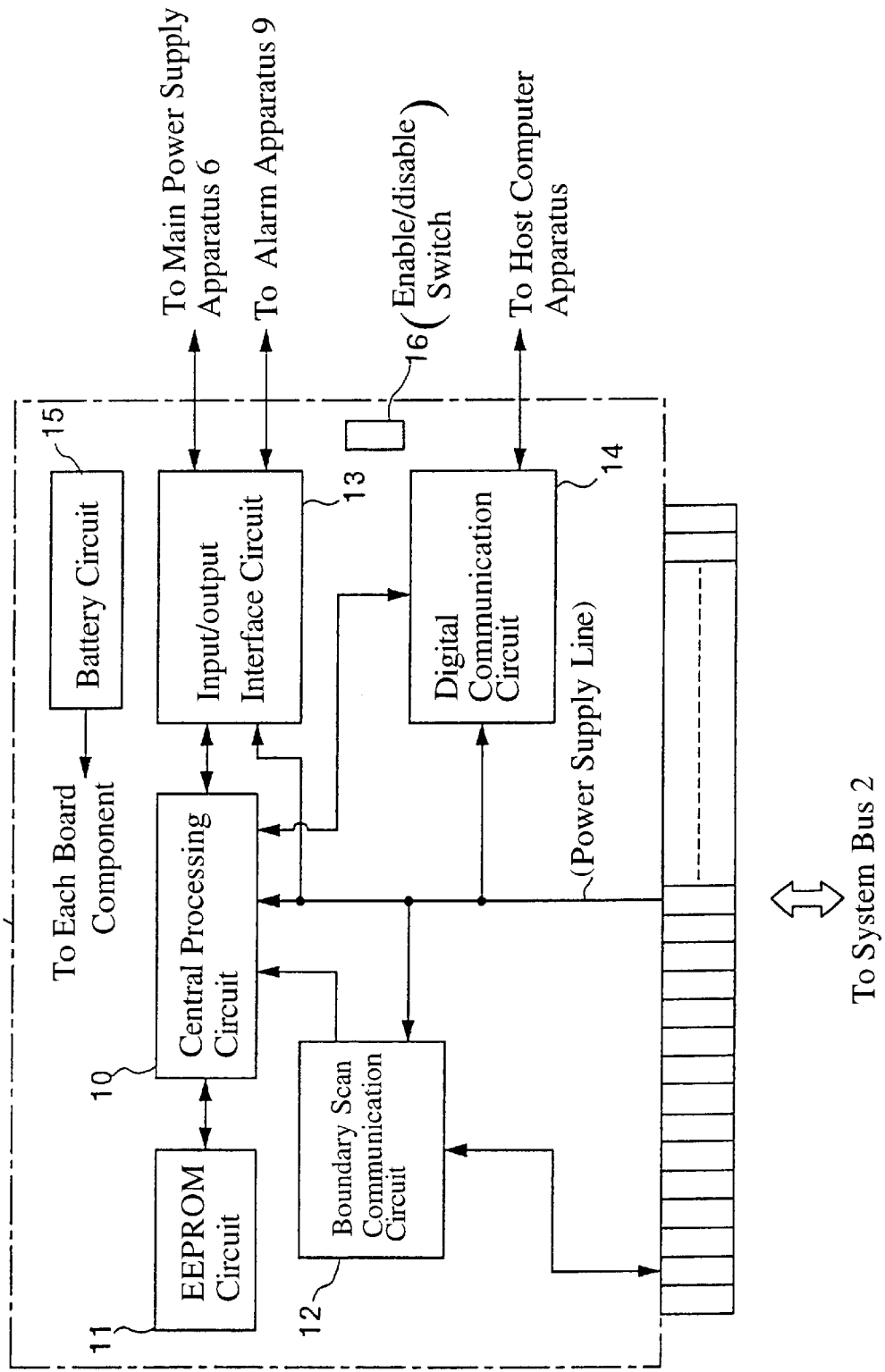
FIG. 5 is a block diagram showing a detailed example of the circuit configuration of the boundary scan controller board shown in FIG. 4.

In this case, effects similar to the above-mentioned embodiment are able to be obtained simply by connecting boundary scan communication circuit 12 of boundary scan controller board 7 to the boundary scan test pins of system bus 2 as shown in FIG. 5.

Figure 6:
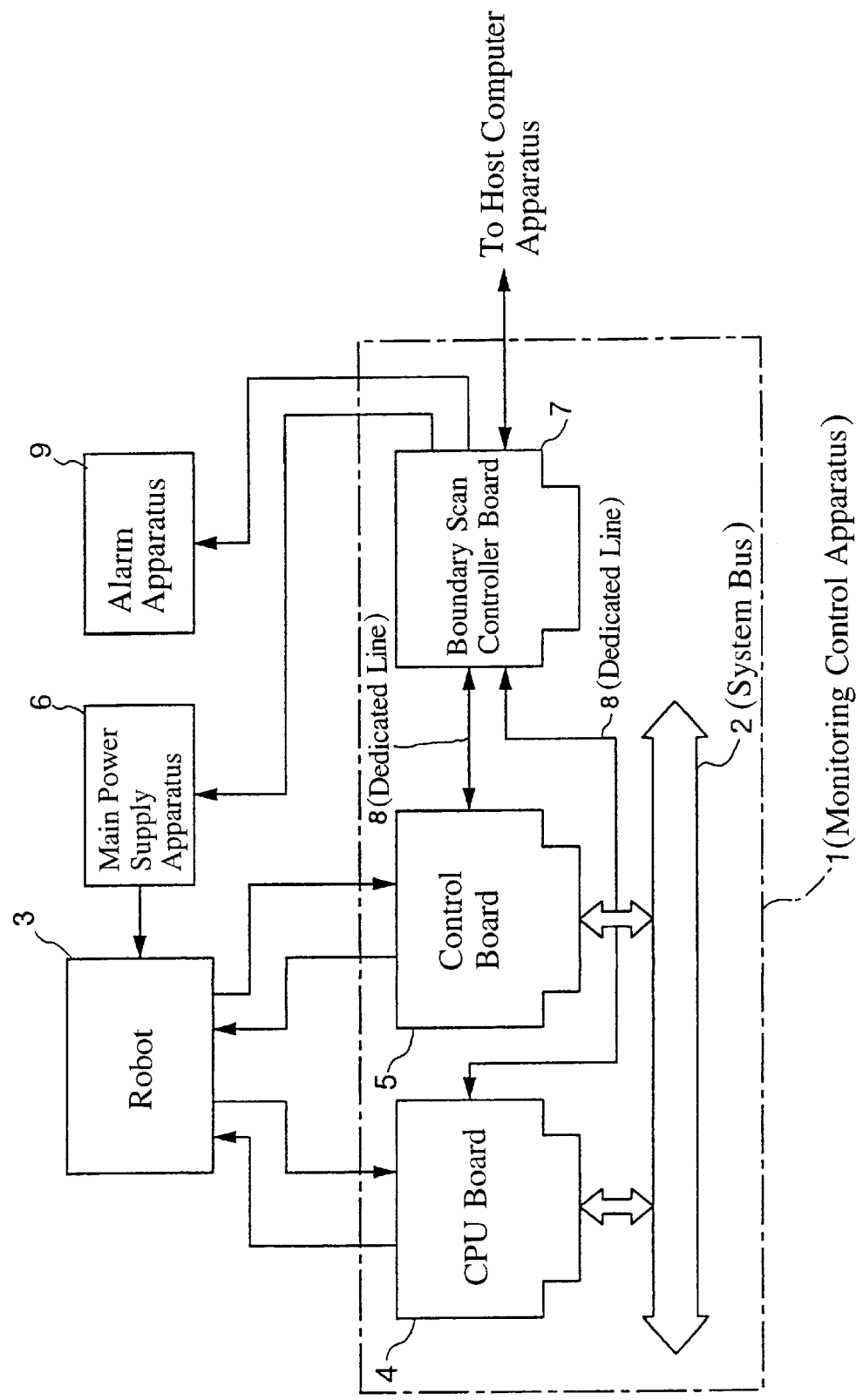
FIG. 6 is a block diagram showing another embodiment of the monitoring control apparatus according to the present invention.

In addition, although boundary scan controller board 7 is connected to system bus 2 to incorporate the power supply voltage in the above-mentioned embodiment, system bus 2 and boundary scan controller board 7 may be completely separated as shown in FIG. 6.

Even if separated in this manner, since battery circuit 15 is loaded on boundary scan controller board 7, boundary scan tests can be performed on CPU board 4 and control board 5 by boundary scan controller board 7.

Consequently, effects similar to those of the above-mentioned embodiment are able to be obtained by arranging boundary scan controller board 7 within the monitoring control apparatus even when there is not enough leeway to provide a connector and so forth in the portion to which system bus 2 is wired.

Constitution of an Embodiment of a Data Processing System

Figure 7:
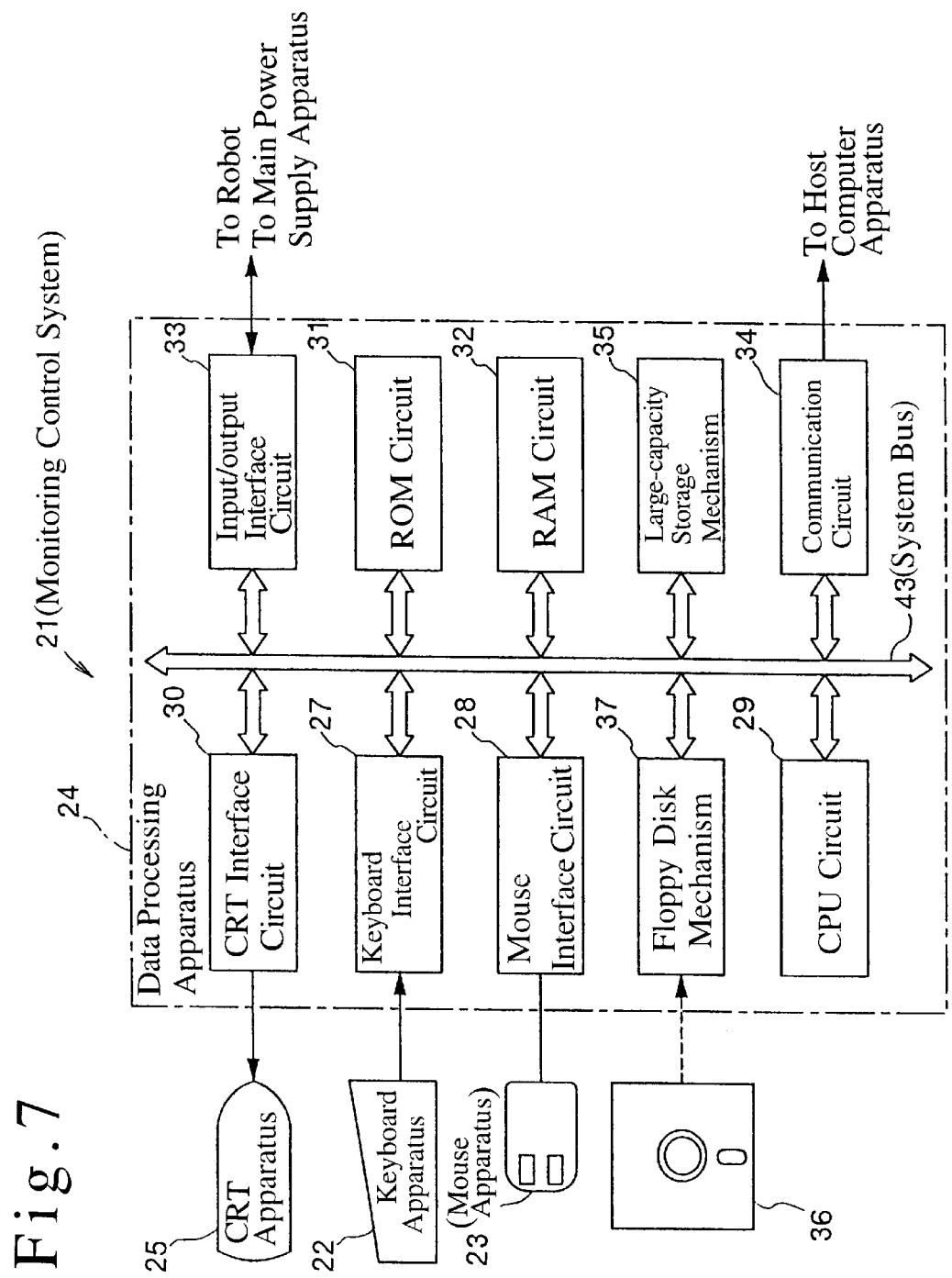
FIG. 7 is a block diagram showing an example of a monitoring control system of a robot using one embodiment of the data processing system according to the present invention.

FIG. 7 is a block diagram showing an example of a monitoring control system of a robot using an embodiment of a data processing system according to the present invention which uses the basic principle previously described.

Monitoring control system 21 shown in this drawing is equipped with keyboard apparatus 22, which has various types of character keys and generates key signals corresponding to the contents of an operation when operated by an operator and so forth; mouse apparatus 23, which has a position detection mechanism using a plurality of keys and a ball that generates switch signals and position data corresponding to the contents of an operation when operated by an operator and so forth; data processing apparatus 24, which performs processing including generation of various types of display data, control data and command data based on switch signals, position data, key signals and various types of preregistered programs output from this mouse apparatus 23 and the above-mentioned keyboard apparatus 22, communication processing for transmitting control data and command data to a robot and so forth, and input/output processing for incorporating various types of detection data from the above-mentioned robot; and, CRT apparatus 25, which incorporates display data generated by this data processing apparatus 24 and displays the screen required for monitoring and controlling the operation of the above-mentioned robot.

Together with controlling the operation of the above-mentioned robot by generating control data and command data while monitoring the operation of the above-mentioned robot by incorporating sensor data output from the robot by data processing apparatus 24 based on the contents of operation of keyboard apparatus 22 and so forth, tests are performed according to the boundary scan test method on each integrated circuit itself that supports the boundary scan test method and on the connection relationships between these integrated circuits by boundary scan test driver 26 (see FIG. 8) that execute the boundary scan test stored in data processing apparatus 24. If there is an abnormality in these integrated circuits or in the connection relationships between these integrated circuits, together with transmitting the contents of the abnormality to a host computer apparatus, a warning display is shown on CRT apparatus 25. Moreover, if the contents of the abnormality have the risk of having a serious effect on the operation of the robot that is being monitored and controlled, from the viewpoint of a fail-safe mechanism, the main power supply apparatus of the above-mentioned robot is interrupted to prevent in advance the robot from running out of control.

The above-mentioned keyboard apparatus 22 is equipped with a keyboard frame formed in the shape of a thin box, various types of keys such as character keys and numeric keys arranged on this keyboard frame, and an encoder circuit arranged within the above-mentioned keyboard frame that generates key signals corresponding to the contents of an operation when each of the above-mentioned keys is operated. When each key is operated by an operator and so forth, key signals are generated corresponding to the contents of that operation which are then supplied to data processing apparatus 24.

In addition, mouse apparatus 23 is equipped with a mouse frame in the shape of a box formed roughly to a size that fits in the hand of the operator, a plurality of keys provided on the upper portion of this mouse frame, a ball arranged to rotate freely within the above-mentioned mouse frame so that a portion protrudes from a hole formed in the bottom surface of the above-mentioned mouse frame, and a rotation detection mechanism arranged within the above-mentioned mouse frame that detects the amount of rotation and direction of rotation of the above-mentioned ball and generates position data corresponding to the direction of movement and amount of movement of the mouse frame. When mouse apparatus 23 is moved over a tabletop or mouse pad by an operator, position data is generated corresponding to its direction of movement and amount of movement which is then supplied to the above-mentioned data processing apparatus 24. In addition, when each of the keys is operated, key signals are generated corresponding to the operated key, which are also supplied to the above-mentioned data processing apparatus 24.

In addition, CRT apparatus 25 is equipped with a box-shaped CRT frame arranged on the above-mentioned data processing apparatus 24, a CRT arranged within the above-mentioned CRT frame so that a portion of it is exposed from the front surface of this CRT frame, and a signal processing circuit arranged within the above-mentioned CRT frame that drives the above-mentioned CRT based on display signals output from the above-mentioned data processing apparatus 24 and displays contents on a screen corresponding to the above-mentioned display signals. CRT apparatus 25 incorporates display signals generated by the above-mentioned data processing apparatus 24, and displays screens necessary for monitoring the operation of a robot and screens necessary for controlling the operation of the above-mentioned robot.

In addition, data processing apparatus 24 is equipped with keyboard interface circuit 27 (portion corresponding to the board described in the fifth to seventh aspects) that incorporates key signals output from the above-mentioned keyboard apparatus 22 and generates various types of commands and data, mouse interface circuit 28 (portion corresponding to the board described in the fifth to seventh aspects) that incorporates switch signals and position data output from the above-mentioned mouse apparatus 23 and generates various types of commands and data, CPU circuit 29 (the portion corresponding to the board described in the fifth to seventh aspects) that performs various types of data processing based on the various types of commands and data generated by mouse interface circuit 28 and keyboard interface circuit 27, CRT interface circuit 30 (the portion corresponding to the board described in the fifth to seventh aspects) that generates display signals by incorporating display data generated by this CPU circuit 29 and supplies these signals to the above-mentioned CRT apparatus 25, ROM circuit 31 (portion corresponding to the board described in the fifth to seventh aspects) in which is stored the basic program that defines the operation of the above-mentioned CPU circuit 29 and various types of constant data and so forth, RAM circuit 32 (portion corresponding to the board described in the fifth to seventh aspects) that is used as the work area of the above-mentioned CPU circuit 29, input/output interface circuit 33 (portion corresponding to the board described in the fifth to seventh aspects that supports signal transfer between the above-mentioned CPU circuit 29, a robot provided on an external apparatus and so forth, and the main power supply apparatus that supplies power to this robot, and communication circuit 34 (portion corresponding to the board described in the fifth to seventh aspects that supports communications between the above-mentioned CPU circuit 29 and a host computer apparatus and so forth.

Moreover, data processing apparatus 24 is equipped with OS main unit 39 (see FIG. 8) of an OS composed of a hard disk apparatus and so forth and having a multitask function used in the above-mentioned CPU circuit 29, examples of which include UNIX, OS/2 (IBM) and WindowsNT (Microsoft), large-capacity storage mechanism 35 (portion corresponding to the board described in the fifth to seventh aspects) in which is stored boundary scan test driver 26, which executes the boundary scan test, test data used by this boundary scan test driver 26, analytical data and various types of application software, floppy disk apparatus 37 (portion corresponding to the board described in the fifth to seventh aspects that performs transfer of information for an external apparatus by means of floppy disk 36, and system bus 43 in the form of a PCI bus, ISAbus and so forth to which pins are assigned for the boundary scan test that connect these components from keyboard interface circuit 27 through floppy disk apparatus 37.

The operation of a robot is controlled by generating control data and command data while monitoring the operating state of the above-mentioned robot by incorporating sensor data output from the robot based on switch signals and position data output from mouse apparatus 23 and key signals output from keyboard apparatus 22. In addition, in parallel with this operation, tests are performed according to the boundary scan test method on each integrated circuit itself that supports the boundary scan test method, on data input to and output from each integrated circuit, and on the connection relationships between these integrated circuits by boundary scan test driver 26. If there is an abnormality in these integrated circuits, in the data that is input to or output from these integrated circuit, or in the connection relationships between these integrated circuits, together with transmitting the contents of the abnormality to a host computer apparatus, a warning display is shown on CRT apparatus 25. Moreover, if the contents of the abnormality have the risk of having a serious effect on the operation of the robot that is being monitored and controlled, from the viewpoint of a fail-safe mechanism, the main power supply apparatus of the above-mentioned robot is interrupted to prevent in advance the robot from running out of control.

In this case, the above-mentioned CPU circuit 29 is equipped with a CPU composed of a microprocessor and so forth that performs various types of processing, and a boundary scan communication circuit which, together with testing each integrated circuit that supports the boundary scan test method provided within CPU circuit 29 using the boundary scan test method, tests each integrated circuit that supports the boundary scan test method within each component from keyboard interface circuit 27 through floppy disk apparatus 37 by means of the above-mentioned system bus 43. Tests are performed using the boundary scan test method on each integrated circuit itself that supports the boundary scan test method, the data input to and output from each integrated circuit, and the connection relationships between the integrated circuits by controlling the boundary scan communication circuit by the CPU based on a test procedure defined with boundary scan test driver 26 stored in the above-mentioned large-capacity storage mechanism 35.

Figure 8:
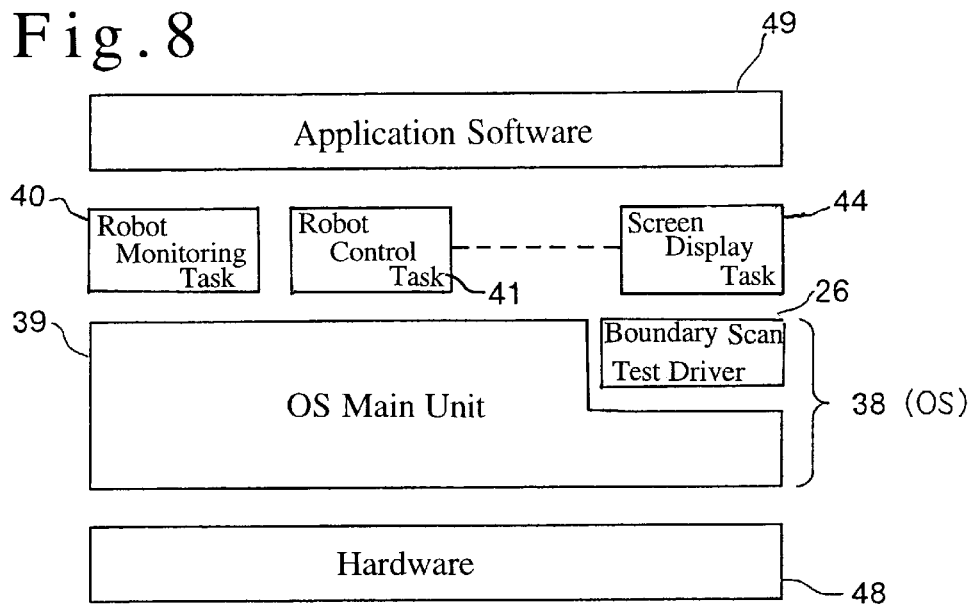
FIG. 8 is a schematic drawing showing an example of the configuration of an OS and so forth housed in the large-capacity storage mechanism shown in FIG. 7.

In addition, boundary scan test driver 26 stored in the above-mentioned large-capacity storage mechanism 35 is incorporated in OS main unit 39 of an OS having a multitask function as shown in FIG. 8, examples of which include UNIX, OS/2 (IBM) and WindowsNT (Microsoft), and is used in the form of OS 38. When the OS main unit is started up, boundary scan test driver 26 is started up simultaneously. As a result, tests are performed using the boundary scan test method on each integrated circuit itself (that supports the boundary scan test method) that composes hardware 48, such as CPU circuit 29, keyboard interface circuit 27, mouse interface circuit 28, CRT interface circuit 30, ROM circuit 31, RAM circuit 32, input/output interface circuit 33, communication circuit 34, floppy disk apparatus 37 and large-capacity storage mechanism 35, data that is input to and output from each integrated circuit and the connection relationships between the integrated circuits, and the operating status of robot monitoring task 40, robot control task 41 and screen display task 42 used in the form of application software 49 started up by the above-mentioned OS 38 is monitored. When an abnormality is found, together with transmitting the contents of the abnormality to a host computer apparatus, a warning display is shown on CRT apparatus 25. Moreover, if the contents of the abnormality have the risk of having a serious effect on the operation of the robot that is being monitored and controlled, from the viewpoint of a fail-safe mechanism, the main power supply apparatus of the above-mentioned robot is interrupted to prevent in advance the robot from running out of control.

Operation of an Embodiment of a Data Processing System

Next, an explanation is provided of the operation of this embodiment while referring to the block diagram shown in FIG. 7 and the schematic drawing shown in FIG. 8.

Figure 9:
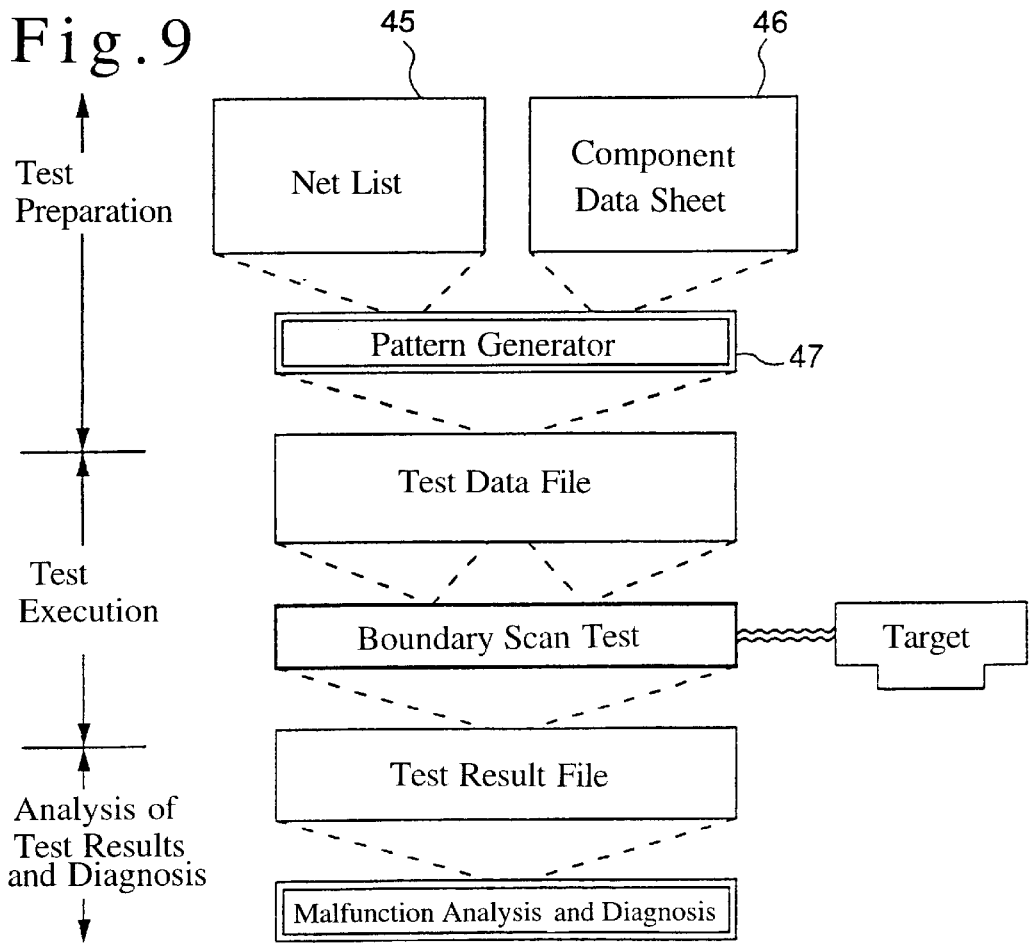
FIG. 9 is a schematic drawing showing an example of the operation of the boundary scan test performed in the monitoring control system shown in FIG. 7.

To begin with, as shown in FIG. 9, before operating monitoring control system 21, pattern generator 47 is started by the host computer apparatus, and test data is generated for checking the operating status of each integrated circuit, the connections of the cables and so forth that compose data processing apparatus 24 and the contents of the printed pattern based on component data sheet 46 of each of the above-mentioned integrated circuits used in data processing apparatus 24 and on net list 45 used when designing data processing apparatus 24. Together with this being filed in a test data file, the analytical data required for evaluating the test results is generated and filed.

Following this, the contents of the test data file and analytical data file generated with the host computer apparatus are incorporated by means of communication circuit 34 of monitoring control system 2 and floppy disk 36, and are stored in large-capacity storage mechanism 35.

If keyboard apparatus 22 and mouse apparatus 23 and so forth are operated resulting in input of robot monitoring and control instructions, the application software required for performing monitoring and control of the robot is selected based on OS 38 stored in large-capacity storage mechanism 35 by CPU circuit 29 followed by starting of robot monitoring task 40, robot control task 41 and screen display task 42.

Consequently, sensor data output from each of the sensors provided in each part of the robot is incorporated by robot monitoring task 40, robot control task 41 and screen display task 42 by means of input/output interface circuit 33 and, together with monitoring the operating status of the robot, control data and command data are generated based on the contents of this monitoring after which this data is supplied to each actuator of the robot by means of input/output interface circuit 33 enabling control of robot operation.

In addition, in parallel with this operation, together with data (sensor data) being incorporated by boundary scan test driver 26 that is input to and output from each integrated circuit (that supports the boundary scan test method) composing CPU circuit 29, keyboard interface circuit 27, mouse interface circuit 28, CRT interface circuit 30, ROM circuit 31, RAM circuit 32, input/output interface circuit 33, communication circuit 34, floppy disk mechanism 37 and large-capacity storage mechanism 35 by controlling the CPU of CPU circuit 29, the above-mentioned sensor data is analyzed based on the analytical data stored in large-capacity storage mechanism 35 to monitor the operating status of robot monitoring task 40, robot control task 41 and screen display task 42 started by the above-mentioned OS 38.

In addition, after detailed test processing of boundary scan test driver 26 is started up, the CPU of CPU circuit 29 is controlled, and test data stored in large-capacity storage mechanism 35 is set for each integrated circuit (that supports the boundary scan test method) composing CPU circuit 29, keyboard interface circuit 27, mouse interface circuit 28, CRT interface circuit 30, ROM circuit 31, RAM circuit 32, input/output interface circuit 33, communication circuit 34, floppy disk mechanism 37 and large-capacity storage mechanism 35 at a predetermined detailed test cycle, each of these integrated circuits entering the operating state. Together with their output data (sensor data) being incorporated, the above-mentioned sensor data is analyzed based on the analytical data stored in large-capacity storage mechanism 35 to monitor the operating contents of robot monitoring task 40, robot control task 41 and screen display task 42 used with each application software 49 started by the above-mentioned OS 38.

When an abnormality is found, together with transmitting the contents of the abnormality to a host computer apparatus, a warning display is shown on CRT apparatus 25. Moreover, if the contents of the abnormality have the risk of having a serious effect on the operation of the robot that is being monitored and controlled, from the viewpoint of a fail-safe mechanism, the main power supply apparatus of the above-mentioned robot is interrupted to prevent in advance the robot from running out of control.

Effect of the Embodiment of a Data Processing System

The functions described below can be obtained since, in the present embodiment, boundary scan test driver 26 is housed in large-capacity storage mechanism 35 composing data processing apparatus 24, the CPU of CPU circuit 29 is controlled by this boundary scan test driver 26, and each integrated circuit itself (that supports the boundary test method) that composes data processing apparatus 24, input/output data of each integrated circuit, and the connection relationships between each integrated circuit are tested using the boundary scan test method.

Function for Confirming Operation of CPU

To begin with, when checking the status signal output from the device pin, the operating status of the CPU can be checked without interrupting the normal processing of the CPU by checking the contents set in the cell of the integrated circuit.

In addition, the contents of the status registers within the CPU can be checked directly using dedicated commands reserved with the boundary scan test. As a result, the operating status of the CPU can be checked without interrupting the normal processing of the CPU.

Moreover, when a self-diagnosis function for the CPU is realized by using dedicated commands reserved with the boundary scan test, although the normal processing of the CPU must be temporarily interrupted, the use of these dedicated commands allows the operating status of the CPU to be checked nearly completely.

Function for Checking Status of I/O Board

In addition, since the status of the I/O ports has a direct effect on the system in this type of monitoring control system 21, by checking the status of the I/O ports such as the connectors of each board using a boundary scan register, any risk of having a serious effect on the system can be detected when such a risk is present.

At this time, since it is predicted that erroneous data may be output from the output ports due to a problem with the hardware even though correct program data is output, by defining specific rules for each piece of data of each output port by using a method using error detection codes such as parity check codes or CRC codes, samples can be obtained from the contents of the boundary scan register of the integrated circuit provided in the final output stage. By then checking whether or not these samples conform to the rules, malfunctions of the output ports can be detected.

When an error has been corrected with a method using error correction codes and so forth even when there is an error in the output data, correct output data can be set in the boundary scan register of the integrated circuit of the final output stage by using a PRELOAD command or EXTEXT command provided in the boundary scan test, and this can then be output from the output ports.

Consequently, the output of erroneous data from the integrated circuit provided in the final output stage can be prevented so that the robot does not operate abnormally without having an effect on system operation.

In addition, when the CPU provided in CPU circuit 29 is in the form of multi-CPU boards, since the output port status of one CPU board can be investigated by using the other CPU board, a mutual check can be made as to whether or not each CPU board is operating normally.

At this time, if some rules (e.g., maximum duration) are clearly defined for individual pieces of bit data, a check can be performed on each piece of bit data in a completely different dimension regardless of the contents of the operating procedure defined with application software 49.

In addition, data input to the input ports can be monitored by performing similar processing for the input ports in the same manner as that for the output ports.

At this time, by performing various checks by establishing rules for the data in terms of individual ports or using characteristics in bit units, a check can be made in each piece of bit data in a completely different dimension regardless of the contents of the operating procedure defined with application software 49.

Even if there is an error in the input data, when the error can be corrected by a method using error correction codes, by setting the correct input in the boundary scan register of the integrated circuits using commands provided with the boundary scan test, and then processing that input, processing can be continued without having to make any changes whatsoever in application software 49.

In addition, in the case in which an integrated circuit has malfunctioned despite correct input data, the malfunction of the integrated circuit can be masked by transferring the contents of the cell provided on the input terminal side of this integrated circuit to the cell provided on the output terminal side.

At this time, if these contents are clearly known even if this integrated circuit performs some form of arithmetic processing, the contents of the cell provided on the input terminal side of the integrated circuit are transferred to the side of CPU circuit 29 where the required arithmetic processing is performed. Consequently, the malfunction can be handled by setting the resulting data in the cell provided on the output terminal side of the above-mentioned integrated circuit, even when this integrated circuit is set to perform some form of arithmetic processing.

Function for Confirming the Status of Various Controllers

In addition, since ASIC devices such as an FDC (floppy disk controller) provided in floppy disk mechanism 37 or large-capacity storage mechanism 35, and a CRTC (CRT controller) provided in CRT interface circuit 30 frequently support the boundary scan test method, the presence or absence of an abnormality can be checked by having these ASIC devices performing self-diagnosis using a self-diagnosis command (RUNBIST command) and so forth when the system is not being used.

When some form of malfunction is found in any of the ASIC devices, together with notifying that a malfunction has been found in the system by a TRAP and so forth, the occurrence of errors in application software 49 can be prevented in advance.

Another Embodiment of a Data Processing System

Figure 10:
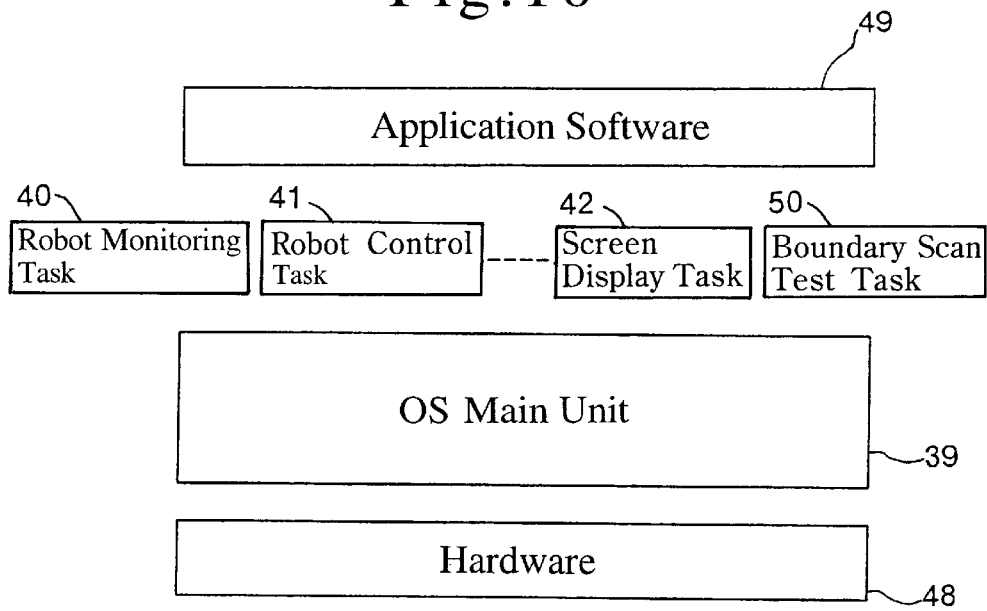
FIG. 10 is a schematic drawing showing an example of the configuration of an OS and so forth used in the monitoring control system of a robot using another embodiment of the data processing system according to the present invention.

In addition, although boundary scan test driver 26 is housed in large-capacity storage mechanism 35 in the form of the driver of OS 38, and is used as a portion of OS 38 in the above-mentioned embodiment, as shown in FIG. 10, the functions of the above-mentioned boundary scan test driver 26 may be given to boundary scan test task 50 that is started by OS main unit 39.

Even if done in this manner, when application program 29 necessary for control of a robot is operated, each integrated circuit itself (that supports the boundary scan test method) that composes data processing apparatus 24, the input/output data of each integrated circuit and the connection relationships between the integrated circuits and so forth can be tested with the boundary scan test method by controlling the CPU of CPU circuit 29 by boundary scan test task 50.

In addition, although boundary scan test driver 26 is stored in large-capacity storage mechanism 35 in the form of a driver of OS 38, and is used as a portion of OS 38 or boundary scan test task 50 is started by OS 38 in each of the above-mentioned embodiments, boundary scan test driver 26 and boundary scan test task 50 may be individually incorporated in each application software 49.

At this time, if boundary scan test driver 26 and boundary scan test task 50 are set so as to start up periodically by timer interruption and so forth at a cycle at which overhead is not excessively large according to the type of system, the boundary scan test can be performed on each integrated circuit and so forth without making the operator aware of the presence of boundary scan test driver 26 or boundary scan test task 50.

In addition, although the boundary scan test is performed by using the CPU and boundary scan communication circuit provided in CPU circuit 29 in the above-mentioned embodiment, a boundary scan controller board may be fabricated according to a dedicated CPU in which a boundary scan test program that performs the boundary scan test is registered and a boundary scan communication circuit, and this may be incorporated in system bus 43 to perform the test according to the boundary scan test method.

In addition, although the contents of a test data file and analytical data file generated with the host computer apparatus are delivered to data processing apparatus 24 by floppy disk 36 in the above-mentioned embodiment, the contents of this test data file and analytical data file, and an application program and so forth containing the boundary scan test program may also be delivered to data processing apparatus 24 by a magnetooptical disk or phase changing optical disk and so forth.

Constitution of an Embodiment of a Communication System

Figure 11:
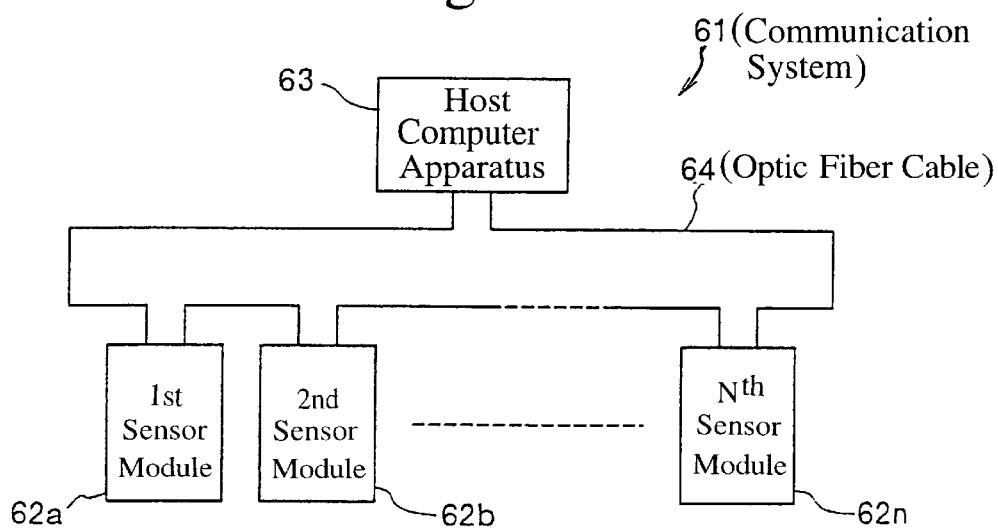
FIG. 11 is a block diagram showing one embodiment of a communication according to the present invention.

FIG. 11 is a block diagram showing an embodiment of a communication system according to the present invention using the basic principle previously described.

Communication system 61 shown in this drawing is equipped with $1^{st}$ through Nth sensor modules (portions corresponding to the electronic equipment in the eighth and ninth aspects) 62a through 62n that are arranged in the portion of each detection target, host computer apparatus 63 arranged in a central control room and so forth, and optic fiber cable 64 that connects these $1^{st}$ through Nth sensor modules 62a through 62n with host computer apparatus 63. This communication system 61 detects events that are the detection targets of $1^{st}$ through Nth sensor modules 62a through 62n, examples of which include the opening or closing of a door and the entrance and exit of people. After transforming these events into output signals by using the input/output function of a boundary scan element (integrated circuit that supports the boundary scan test method), the output signals are converted into optical signals which are transmitted to host computer apparatus 63 using a serial transmission format.

Figure 12:
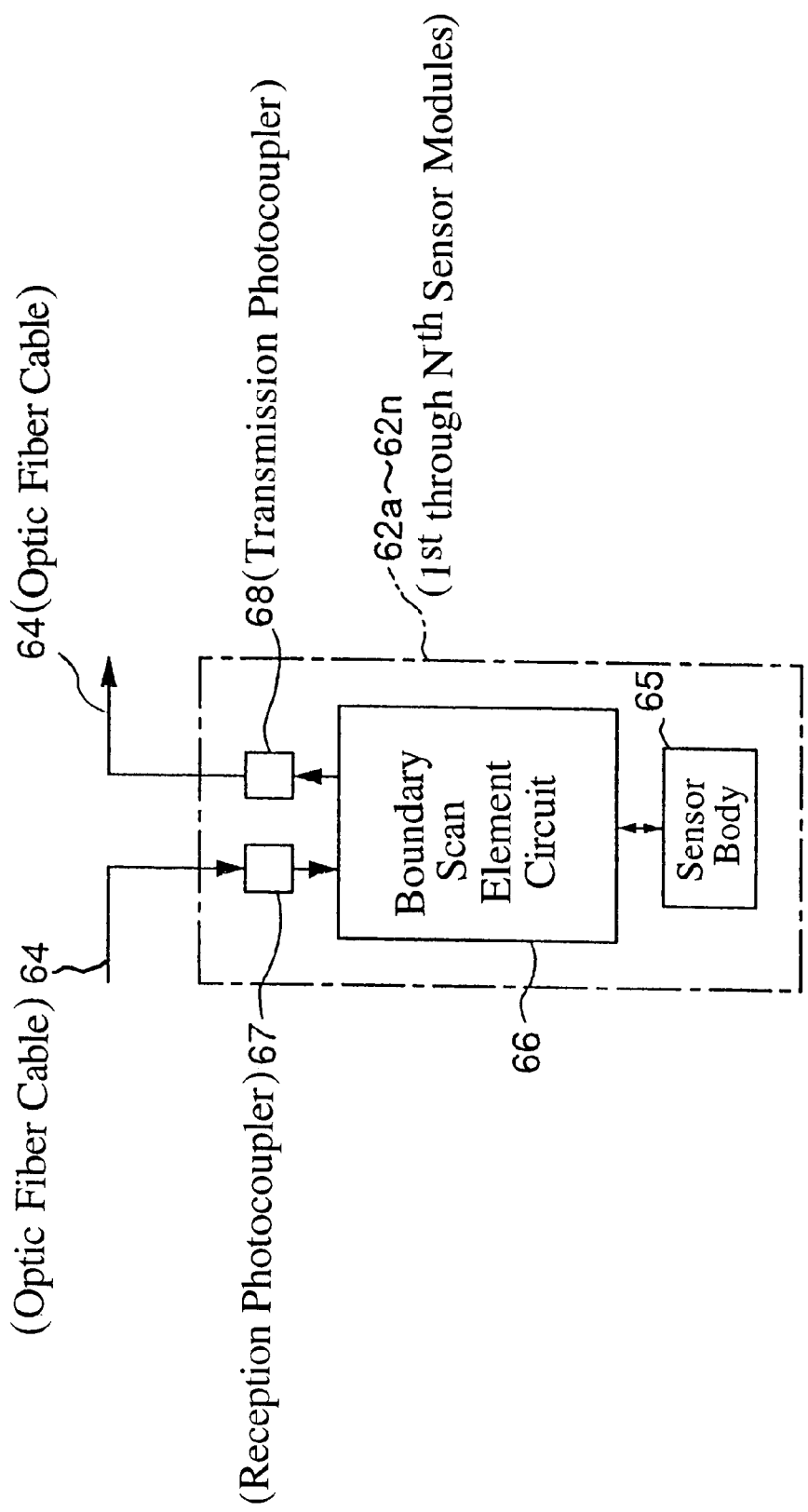
FIG. 12. is a block diagram showing a detailed example of the circuit configuration of the 1$^{st}$ through Nth sensor modules shown in FIG. 11.

As shown in FIG. 12, each $1^{st}$ through Nth sensor module 62a through 62n is equipped with sensor body 65 that detects the opening and closing of a door or the entrance and exit of people and so forth; boundary scan element circuit 66, which is composed of a boundary scan element having at least one boundary scan function, that performs processing such as detection of the opening and closing of a door or the entrance and exit of people and so forth by controlling the above-mentioned sensor body 65 based on preset detection conditions, and processing in which other sensor modules communicate with host computer apparatus 63 by means of the above-mentioned optic fiber cable 64 by using the serial data input/output function of the boundary scan element; reception photocoupler 67 that converts the optical signals supplied by means of the above-mentioned optic fiber cable 64 into electrical signals and inputs them into the above-mentioned boundary scan element circuit 66; and, transmission photocoupler 68 that converts electrical signals output from the above-mentioned boundary scan element circuit 66 and sends them within optical fiber cable 64.

These $1^{st}$ through Nth sensor modules 62a through 62n either receive optical signals transmitted from host computer apparatus 63 by means of optic fiber cable 64, convert these optical signals into electrical signals, input these electrical signals into each boundary scan element within boundary scan element circuit 66, and set data such as detection conditions in each boundary scan element, or convert serial data output from each boundary scan element into optical signals, emit said optical signals into optic fiber cable 64 and transmit said optical signals to sensor modules or host computer apparatus 63 of the next stage.

Figure 13:
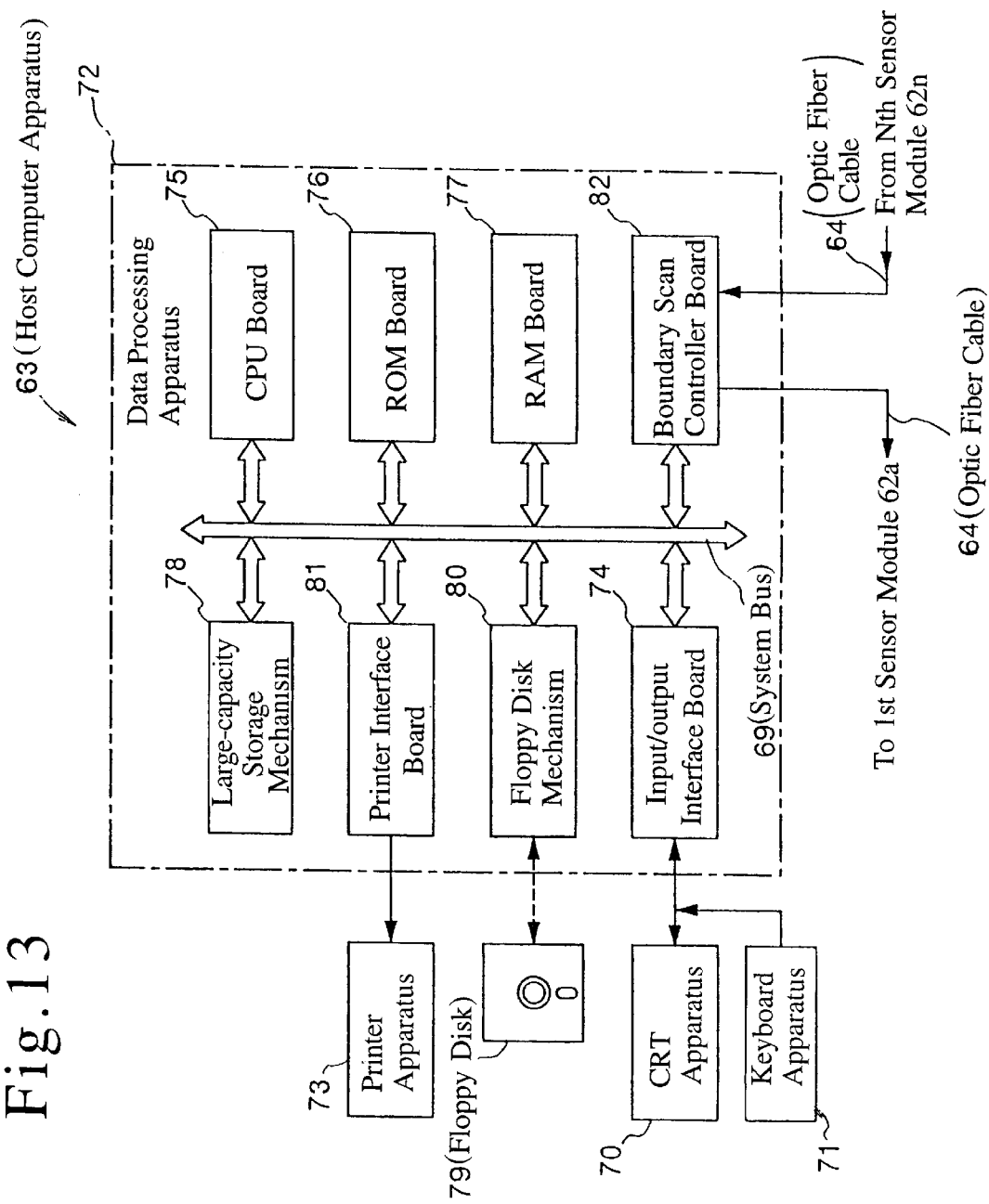
FIG. 13 is a block diagram showing a detailed example of the circuit configuration of the host computer apparatus shown in FIG. 11.

In addition, as shown in FIG. 13, the above-mentioned host computer apparatus 63 is equipped with CRT apparatus 70, which displays the contents specified with display data on a screen when this display data is supplied; keyboard apparatus 71 having a plurality of keys, which generates key signals corresponding to the contents of an operation when operated by an operator; data processing apparatus 72, which performs processing which executes a specified job according to the contents of operation of this keyboard apparatus 71, processing which displays various screens on the above-mentioned CRT apparatus 70, communication processing between lst through Nth sensor modules 62a through 62n by means of the above-mentioned optic fiber cable 64; and, printer apparatus 73, which prints the contents indicated by printing data on specified paper and then discharges that paper by incorporating printing data from this data processing apparatus 72 when said printing data is output. This host computer apparatus 63 performs the specified data processing and so forth based on commands and data designated with key signals output from keyboard apparatus 71, and either displays the results of this processing on the above-mentioned CRT apparatus 70 or prints out the processing results from printer apparatus 73. Moreover, if the instructions specified with the above-mentioned keyboard apparatus 71 are transmission control, data is generated that sets the detection conditions and so forth of $1^{st}$ through Nth sensor modules 62a through 62n and together with this data being converted into optical signals, it is sequentially transmitted to $1^{st}$ through Nth sensor modules 62a through 62n by means of optic fiber cable 64. The detection conditions and so forth of these lst through Nth sensor modules 62a through 62n are then set and detection operation is performed at a specified detection cycle according to these detection conditions. $1^{st}$ through Nth sensor modules 62a through 62n are then driven at a predetermined cycle, and together with the detection results obtained with these $1^{st}$ through Nth sensor modules 62a through 62n being converted into optical signals of a serial signal format, these optical signals are sequentially transferred and incorporated in $1^{st}$ through Nth sensor modules 62a through 62n and each optical fiber cable 64, with this being controlled in batch form.

In addition, the above-mentioned data processing apparatus 72 is equipped with system bus 69 in the form of a PCI bus and so forth having pins that support the boundary scan test method; input/output interface board 74, which performs processing such as supplying display data to the above-mentioned CRT apparatus 70 and generating various types of commands and various types of data by incorporating key signals output from the above-mentioned keyboard apparatus 71; CPU board 75, which executes various types of jobs designated with various types of commands and various types of data output from this input/output interface board 74; ROM board 76, in which is contained the basic OS, which defines the basic operation of the above-mentioned CPU board 75, and various data; RAM board 77, which is used as the work area and so forth of the above-mentioned CPU board 75; and large-capacity storage mechanism 78, which is used as the storage area of the general-purpose OS (e.g., WindowsNT, UNIX) having multitask functions that define the operation of the above-mentioned CPU board 75, the storage area of application programs that define various types of jobs, the storage area of data on which processing is performed, the storage area of data transmitted from $1^{st}$ through Nth sensor modules 62a through 62n, and the storage area of processing results.

Moreover, the above-mentioned data processing apparatus 72 is equipped with floppy disk mechanism 80, which performs writing and reading of data from and to floppy disk 79 when floppy disk 79 is installed; printer interface board 81, which incorporates printing data output from the above-mentioned CPU board 75, supplies that data to the above-mentioned printer apparatus 73, prints the contents of the above-mentioned printing data onto paper and discharges that paper; and, boundary scan controller board 82, which converts data transmitted from the above-mentioned CPU board 75 into serial signals each time said data is output, converts those serial signals into optical signals, transfers these optical signals to the above-mentioned 1st through Nth sensor modules 62a through 62n by means of optic fiber cable 64, and either sets the data for these $1^{st}$ through Nth sensor modules 62a through 62n, or collects the data by output of optical signals from these $1^{st}$ through Nth sensor modules 62a through 62n.

Figure 14:
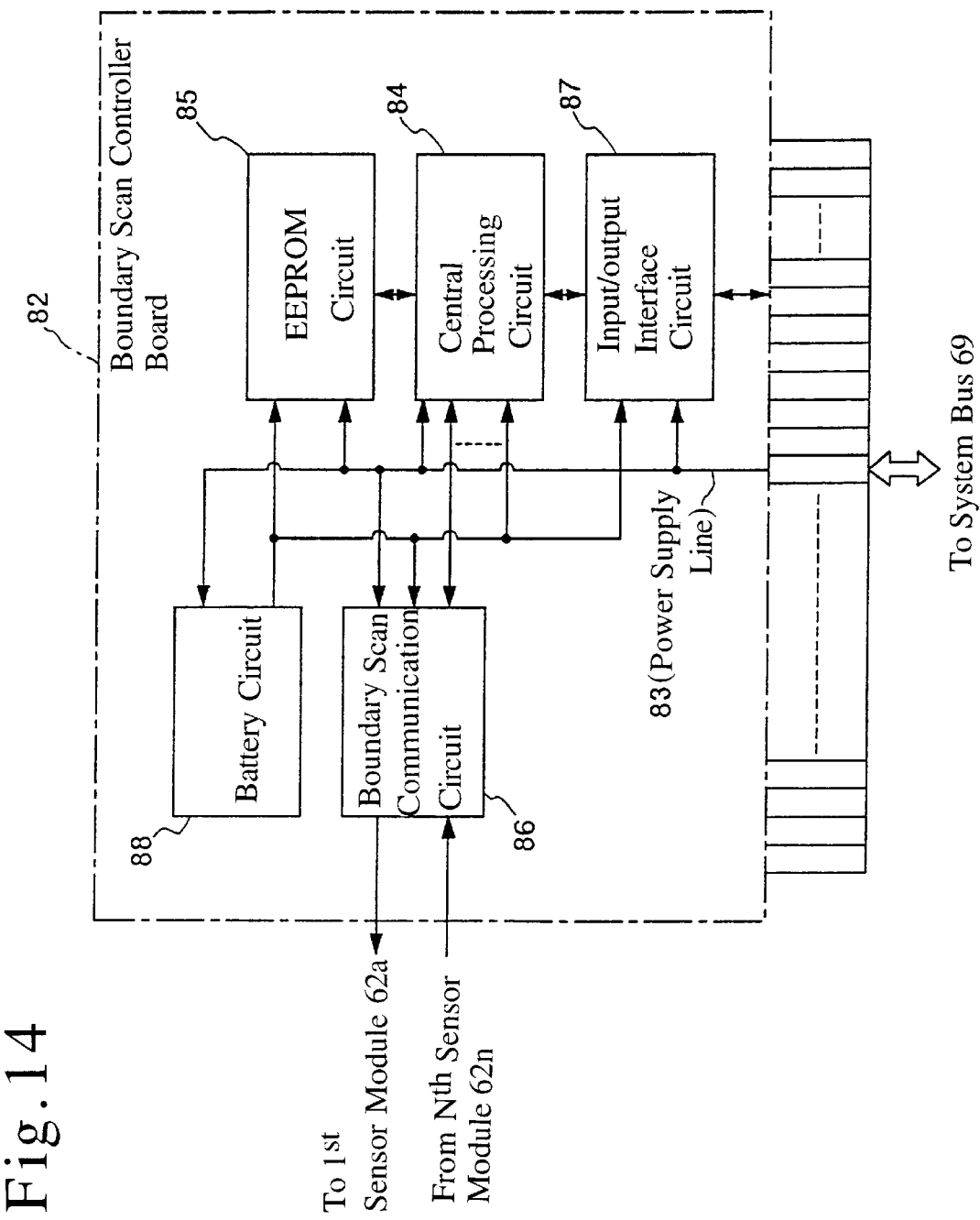
FIG. 14. is a block diagram showing a detailed example of the circuit configuration of the boundary scan controller board shown in FIG. 13.

In this case, as shown in FIG. 14, the above-mentioned boundary scan controller board 82 is equipped with central processing circuit 84, which is composed of a microprocessor and so forth that operates by using power supply voltage supplied from power supply line 83 connected to the power supply pin of the above-mentioned system bus 69, and performs various types of data processing required in the boundary scan test; EEPROM circuit 85, which serves as the storage area of the data and so forth used in this central processing circuit 84, and performs reading and writing of data according to the above-mentioned central processing circuit 84; boundary scan communication circuit 86, which operates by using the power supply voltage supplied from the above-mentioned power supply line 83, and performs writing and collection of data using boundary scan functions for the $1^{st}$ through Nth sensor modules 62a through 62n by means of optic fiber cable 64 based on various types of instructions output from the above-mentioned central processing circuit 84; input/output interface circuit 87, which operates by using the power supply voltage supplied from the above-mentioned power supply line 83, and supports communications between the above-mentioned central processing circuit 84 and the above-mentioned CPU board 75 and so forth using system bus 69; and, parity circuit 88, which is charged by power supply voltage supplied from the above-mentioned system bus 69, and is used for back-up by supplying power supply voltage to each of the components from the above-mentioned central processing circuit 84 through input/output interface circuit 87 when the supply of the above-mentioned power supply voltage has been interrupted.

Operation of an Embodiment of a Communication System

Figure 15:
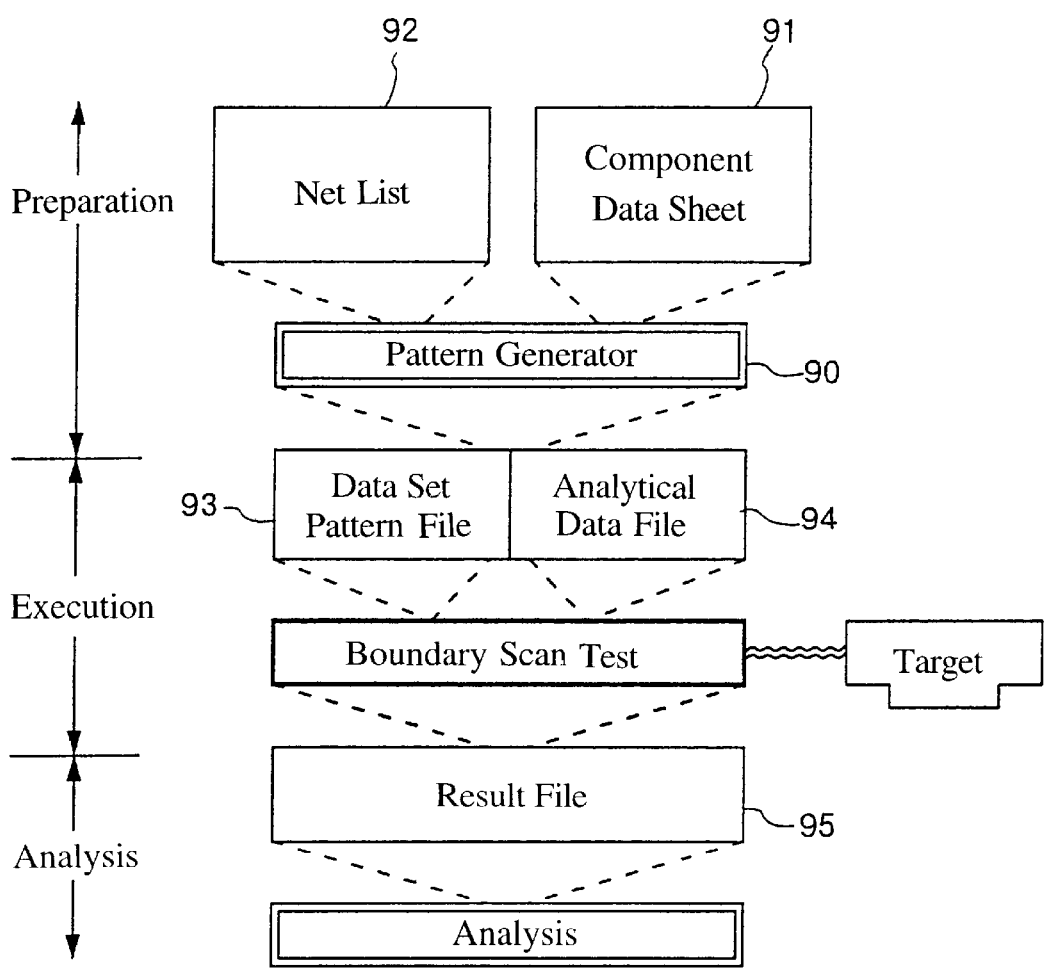
FIG. 15 is a schematic drawing showing an example of the procedure for preparing the data set pattern and analytical data contained in the, EPROM circuit shown in FIG. 14.

Next, an explanation is provided for the operation of this embodiment while referring to the block diagrams shown in FIGS. 13 and 14, and the schematic drawing shown in FIG. 15.

To begin with, before actually operating $1^{st}$ through Nth sensor modules 62a through 62n, as shown in FIG. 15, pattern generator 90 is started by a computer apparatus (omitted from the drawing), and data set patterns are generated corresponding to the connections, printed patterns and so forth of the cables that compose boundary scan elements and $1^{st}$ through Nth sensor modules 62a through 62n based on component data sheet 91 of each boundary scan element and so forth used with $1^{st}$ through Nth sensor modules 62a through 62n and net list 92 used when designing 1st through Nth sensor modules 62a through 62n. Together with these data set patterns filed in data set pattern file 93, analytical data is generated that is required for returning the detection results gathered with $1^{st}$ through Nth sensor modules 62a through 62n to ordinary parallel data. This analytical data is then filed in analytical data file 94, and the contents of data set pattern file 93 and analytical data file 94 are stored in EEPROM circuit 85.

Following this, when boundary scan controller board 82 is started based on instructions from the above-mentioned CPU board 75, boundary scan communication circuit 86 is controlled by central processing circuit 84 in accordance with the data set pattern stored in EEPROM circuit 85, and detection conditions and so forth output from the above-mentioned CPU board 75 are converted to optical signals. These optical signals are then emitted into optic fiber cable 64, transferred to $1^{st}$ through Nth sensor modules 62a through 62n, and detection conditions and so forth are set for these 1st through Nth sensor modules 62a through 62n.

At this time, when setting detection condition data and so forth for all $1^{st}$ through Nth sensor modules 62a through 62n, each boundary scan element provided in boundary scan element circuit 66 of $1^{st}$ through Nth sensor modules 62a through 62n is put into the data set mode by boundary scan communication circuit 86. Following this, the $1^t$ through Nth detection condition data for $1^{st}$ through Nth sensor modules 62a through 62n that is output from CPU board 75 is sequentially arranged in a row while being converted into serial data, and together with being emitted into optic fiber cable 64 in the form of optical signals, the data is sequentially shifted and set in the $1^{st}$ through Nth sensor modules 62a through 62n.

In addition, when setting detection condition data and so forth for only one of $1^{st}$ through Nth sensor modules 62a through 62n such as Nth sensor module 62n, together with each boundary scan element provided in boundary scan element circuit 66 of $1^{st}$ through Nth–1 sensor modules 62a through 62n–1 being put into the bypass mode by boundary scan communication circuit 86, each boundary scan element provided in boundary scan element circuit 66 of Nth sensor module 62n is put into the data set mode. Following this, the Nth detection conditions data that is output from CPU board 75 is converted into serial data, and together with being emitted into optic fiber cable 64 in the form of optical signals, is sequentially shifted and set in Nth sensor module 62n.

Next, optical signals required for starting $1^{st}$ through Nth sensor modules 62a through 62n are generated based on instructions from the above-mentioned CPU 75, and these optical signals are transferred to 1st through Nth sensor modules 62a through 62n by means of optic fiber cable 64 and set in boundary scan element circuit 66 of these $1^{st}$ through Nth sensor modules 62a through 62n after which as that detection of the opening and closing of doors or the entrance and exit of people is begun by these $1^{st}$ through Nth sensor modules 62a through 62n.

Then, together with the detection results from the TDO terminal of each boundary scan element of boundary scan element circuit 66 provided in 1st through Nth sensor modules 62a through 62n being output based on instructions from the above-mentioned CPU board 75, these results are converted into optical signals which are sequentially incorporated by means of 1st through Nth sensor modules 62a through 62n and each optic fiber cable 64, converted into parallel data and transferred to the above-mentioned CPU board 75.

Consequently, the detection results obtained with 1st through Nth sensor modules 62a through 62n are incorporated by CPU board 75 and are then analyzed in batch form after being stored in large-capacity storage mechanism 78 in the form of result file 95.

Effect of the Embodiment of a Communication System

Thus, in this embodiment, after transforming the detection targets of 1st through Nth sensor modules 62a through 62n, examples of which include the opening or closing of a door and the entrance and exit of people, into output signals using the input/output functions of the boundary scan elements, these output signals are converted into optical signals which are then transferred to host computer apparatus 63 using a serial transmission format to control these events. Consequently, 1st through Nth sensor modules 62a through 62n and host computer apparatus 63 can be connected without using a communication bus, and as a result, the overall production cost of the system can be reduced since communication devices are not used. In addition, since the boundary scan element itself has a data transfer rate of about 20 Mbps, the data transfer rate between 1st through Nth sensor modules 62a through 62n and host computer apparatus 63 can be increased up to a maximum of roughly 20 Mbps, which is able to dramatically shorten the amount of time required for collecting data obtained with 1st through Nth sensor modules 62a through 62n or setting detection conditions for 1st through Nth sensor modules 62a through 62n.

Another Embodiment of a Communication System

In addition, although 1st through Nth sensor modules 62a through 62n and host computer apparatus 63 are connected by optic fiber cable 64 in the above-mentioned embodiment, an ordinary communication wire or communication line may be used in place of this optic fiber cable 64.

Even if this is done, however, data transfer can be performed at a data transfer rate of roughly 20 Mbps possessed by each boundary scan element provided in boundary scan element circuit 66 of 1st through Nth sensor modules 62a through 62n when this ordinary communication wire or communication line has a sufficient communication rate.

In addition, although a communication system 61 is constructed by connecting decentralized 1st through Nth sensor modules 62a through 62n with host computer apparatus 63 arranged in a monitoring room, a communication system may also be constructed by connecting distributed terminal apparatuses with a host computer apparatus 63 arranged in a monitoring room.

Even if this is done, however, data transfer can be performed at a data transfer rate of roughly 20 Mbps by using the serial data transfer function possessed by the boundary scan element circuit if this boundary scan element circuit is provided within each terminal apparatus.

In addition, although central processing circuit 84 and EEPROM circuit 85 are provided in boundary scan control board 82 arranged within host computer apparatus 63 in the above-mentioned embodiment to gather or analyze data from 1st through Nth sensor modules 62a through 62n by storing the contents of data set pattern file 93 and analytical data file 94 in EEPROM circuit 85, when there is leeway in the processing capacity of CPU board 75 in host computer 63 and in the capacity of large-capacity storage mechanism 78, data may be gathered or analyzed from 1st through Nth sensor modules 62a through 62n by storing the contents of data set pattern file 93 and analytical data file 94 in large-capacity storage mechanism 78 and directly controlling boundary scan communication circuit 86 of boundary scan control board 82 with CPU board 75.

As a result of doing this, central processing circuit 84 and EEPROM circuit 85 can be removed from boundary scan control board 82, thereby enabling the constitution of boundary scan control board 82 to be simplified.

In addition, printer apparatus 73 may be removed from data processing apparatus 72 that composes host computer apparatus 63, dedicated lines may be connected to the input/output connectors of printer interface board 81 provided in data processing apparatus 72, and data processing apparatus 72 may be connected with 1st through Nth sensor modules 62a through 62n with these dedicated lines.

By doing this, data can be gathered from 1st through Nth sensor modules 62a through 62n, or data can be set in 1st through Nth sensor modules 62a through 62n without using boundary scan controller board 82, thereby making it possible to significantly reduce the overall production cost of communication system 61.

What is claimed is:

1. A monitoring control apparatus for monitoring and controlling a monitoring and control target comprising,
    a CPU board;
    various types of boards including components that support a boundary scan test method; and,
    a boundary scan controller board electrically connected to these boards for testing each of said boards or each component loaded on each of these boards by performing a boundary scan test, said boundary scan controller board including a boundary scan register using boundary scan functions and having cells, and a TDI terminal so that when control data formed of serial data is input into the TDI terminal, the control data is shifted and set in a predetermined cell, which is directly output from said predetermined cell, wherein
    said boundary scan controller board has at least one of functions consisting of a function that checks an operation of the CPU board, a function that checks a status of the TDI terminal, a function that checks a status of the boundary scan register and a function that detects and corrects erroneous data.

2. A monitoring control apparatus as set forth in claim 1 wherein, said boundary scan controller board uses a power supply that is independent from a power supply apparatus of each of said boards so that even if abnormality occurs in the power supply apparatus of each board, each of said boards or each component loaded on each board can be tested by performing the boundary scan test on each board by said boundary scan controller board.

3. A monitoring control apparatus as set forth in claim 1 wherein, said boundary scan controller board is connected to each of said boards by a dedicated line provided for each of said boards, and the boundary scan test is performed on each of said boards individually.

4. A monitoring control apparatus as set forth in claim 1 wherein, said boundary scan test is enabled or disabled based on an operation of an enable/disable switch.

5. A data processing system for performing designated processing while controlling an operation of each part of the system comprising:

a CPU circuit;

boards loaded with integrated circuits for supporting a boundary scan test method and having a boundary scan register;

dedicated lines for connecting each of these boards, and CPU to exclusively perform a boundary scan test; and a boundary scan test driver or boundary scan test task for performing the boundary scan test on each board or on each integrated circuit loaded on each of said boards, said boundary scan test task performing the boundary scan test for a device to be controlled and having a monitor function for monitoring the device to be controlled so that the boundary scan test task forms control data based on logic output of the boundary scan register and outputs the control data, wherein said boundary scan test driver or boundary scan test task has at least one of functions consisting of a function that checks an operation of the CPU circuit, a function that checks a status of I/O ports, a function that checks a status of each controller and a function that detects and corrects erroneous data.

6. A data processing system as set forth in claim 5 wherein, said boundary scan test driver or boundary scan test task is incorporated in an OS or application software that defines an operation of said CPU circuit.

7. A communication system comprising:

a plurality of decentralized electronic devices having boundary scan elements with boundary scan test functions, each of said boundary scan element having a serial data input/output function so that input and output of serial data from and to each of said electronic devices are made without node by the boundary scan elements of said electronic devices, and a host computer having a boundary scan controller board and optic fiber cables connected among the host computer and the electronic devices, wherein said boundary scan controller board has at least one of functions consisting of a function that checks an operation of the electronic devices, a function that checks a status of the boundary scan elements, a function that checks a status of the optic fiber cables and a function that detects and corrects erroneous data.

8. A communication system as set forth in claim 7 wherein, each electronic device is connected by an optic fiber cable, and optical signals are used for the serial data transferred between each of said electronic devices.

9. monitoring control apparatus as set forth in claim 1, wherein said boundary scan control board further includes input and output terminals, a TDO terminal, and a TAP controller for controlling the boundary scan registers so that in testing, the boundary scan controller board is operated, and the control data set in the predetermined cell is output from the TDO terminal, which is compared with input data to determine operation of the boards.

* * * * *